(12) United States Patent
Takemura

(10) Patent No.: US 8,837,202 B2
(45) Date of Patent: Sep. 16, 2014

(54) SEMICONDUCTOR MEMORY DEVICE AND METHOD FOR DRIVING THE SAME

(75) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 131 days.

(21) Appl. No.: 13/236,965

(22) Filed: Sep. 20, 2011

(65) Prior Publication Data

US 2012/0075917 A1   Mar. 29, 2012

(30) Foreign Application Priority Data

Sep. 29, 2010 (JP) ................................ 2010-218567
Oct. 26, 2010 (JP) ................................ 2010-239525
Nov. 12, 2010 (JP) ................................ 2010-253556

(51) Int. Cl.
*G11C 11/24* (2006.01)

(52) U.S. Cl.
USPC .. 365/149; 365/129; 365/185.21; 365/185.26

(58) Field of Classification Search
CPC ............................ G11C 11/404; H01L 27/108
USPC .................................. 365/149, 206, 207, 205
See application file for complete search history.

(56) References Cited

U.S. PATENT DOCUMENTS

| | | |
|---|---|---|
| 4,466,081 A | 8/1984 | Masuoka |
| 4,777,625 A | 10/1988 | Sakui et al. |
| 4,982,372 A | 1/1991 | Matsuo |
| 5,302,843 A | 4/1994 | Yamazaki |
| 5,731,856 A | 3/1998 | Kim et al. |
| 5,744,844 A | 4/1998 | Higuchi |
| 5,744,864 A | 4/1998 | Cillessen et al. |
| 5,888,868 A | 3/1999 | Yamazaki et al. |
| 5,998,820 A * | 12/1999 | Chi ............................... 257/296 |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Son Dinh
*Assistant Examiner* — Uyen B Tran
(74) *Attorney, Agent, or Firm* — Fish & Richardson P.C.

(57) ABSTRACT

In a conventional DRAM, when the capacitance of a capacitor is reduced, an error of reading data easily occurs. A plurality of cells are connected to one bit line MBL_m. Each cell includes a sub bit line SBL_n_m and 4 to 64 memory cells (a memory cell CL_n_m_1 or the like). Further, each cell includes selection transistors STr1_n_m and STr2_n_m and an amplifier circuit AMP_n_m that is a complementary inverter or the like is connected to the selection transistor STr2_n_m. Since parasitic capacitance of the sub bit line SBL_n_m is sufficiently small, potential change due to electric charge in a capacitor of each memory cell can be amplified by the amplifier circuit AMP_n_m without an error, and can be output to the bit line.

18 Claims, 17 Drawing Sheets

(56) References Cited

U.S. PATENT DOCUMENTS

| | | | |
|---|---|---|---|
| 6,127,702 A | 10/2000 | Yamazaki et al. |
| 6,294,274 B1 | 9/2001 | Kawazoe et al. |
| 6,314,017 B1 | 11/2001 | Emori et al. |
| 6,445,026 B1 | 9/2002 | Kubota et al. |
| 6,536,013 B2 | 3/2003 | Kobayashi et al. |
| 6,563,174 B2 | 5/2003 | Kawasaki et al. |
| 6,574,148 B2 | 6/2003 | Chevallier |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,088,603 B2 | 8/2006 | Patel |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,859,889 B2 | 12/2010 | Kameshiro et al. |
| 7,935,582 B2 | 5/2011 | Iwasaki |
| 7,956,361 B2 | 6/2011 | Iwasaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0170050 A1* | 9/2004 | Itoh et al. ............... 365/149 |
| 2005/0017302 A1 | 1/2005 | Hoffman |
| 2005/0073871 A1* | 4/2005 | Luk et al. ............... 365/149 |
| 2005/0128803 A1 | 6/2005 | Luk et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0242543 A1* | 10/2007 | Romanovskyy et al. ...... 365/208 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0266925 A1 | 10/2008 | Lukes et al. |
| 2008/0285362 A1 | 11/2008 | Kang et al. |
| 2008/0296568 A1 | 12/2008 | Ryu et al. |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2010/0290262 A1 | 11/2010 | Scheuerlein et al. |
| 2011/0089419 A1 | 4/2011 | Yamazaki et al. |
| 2011/0101334 A1 | 5/2011 | Yamazaki et al. |
| 2011/0114946 A1 | 5/2011 | Saito |
| 2012/0057396 A1 | 3/2012 | Yamazaki et al. |
| 2012/0063208 A1 | 3/2012 | Koyama et al. |
| 2012/0063209 A1 | 3/2012 | Koyama et al. |
| 2012/0081948 A1 | 4/2012 | Takemura |
| 2012/0112257 A1 | 5/2012 | Kato |
| 2012/0113707 A1 | 5/2012 | Takemura |
| 2012/0182790 A1 | 7/2012 | Yamazaki et al. |
| 2012/0193697 A1 | 8/2012 | Takemura |
| 2012/0195104 A1 | 8/2012 | Takemura |
| 2012/0199842 A1 | 8/2012 | Takemura |

FOREIGN PATENT DOCUMENTS

| | | |
|---|---|---|
| JP | 56-162875 A | 12/1981 |
| JP | 60-198861 A | 10/1985 |
| JP | 62-230043 A | 10/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-053164 A | 2/2001 |
| JP | 2002-076356 A | 3/2002 |
| JP | 2002-093924 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| | | |
|---|---|---|
| JP | 2004-273732 A | 9/2004 |
| JP | 2007-042172 A | 2/2007 |
| JP | 2007-096055 A | 4/2007 |
| JP | 2007-123861 A | 5/2007 |
| WO | 2004/114391 A1 | 12/2004 |

OTHER PUBLICATIONS

Orita, M et al., "Amorphous transparent conductive oxide InGaO3(ZnO)m (m<4):a Zn4s Condctor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; AGNE Gijutsu Center, with English translation.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Shoji Shukuri et al.; "A Semi-Static Complementary Gain Cell Technology for Sub-1 V Supply DRAM's"; IEEE Transactions on Electron Devices; Jun. 1, 1994; pp. 926-931.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

(56) References Cited

OTHER PUBLICATIONS

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, n. et al., "Spinel,YBFE2O4, and YB2FE3O7 Types of Structures for Compounds in the IN2O3 and SC2O3-A2O3-Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Kinam Kim; "Technology for sub-50nm DRAM and NAND Flash Manufacturing"; IEDM 05: Technical Digest of International Electron Devices Meeting; Dec. 5, 2005; pp. 333-336.

W. Mueller et al.; "Challenges for the DRAM Cell Scaling to 40nm"; IEDM 05: Technical Digest of International Electron Devices Meeting; 2005; pp. 347-350.

Shoji Shukuri et al.; "A Semi-Static Complementary Gain Cell Technology for Sub-1 V Supply DRAM's"; IEEE Transactions on Electron Devices; Jun. 1, 1994; pp. 926-931, vol. 41, No. 6.

\* cited by examiner

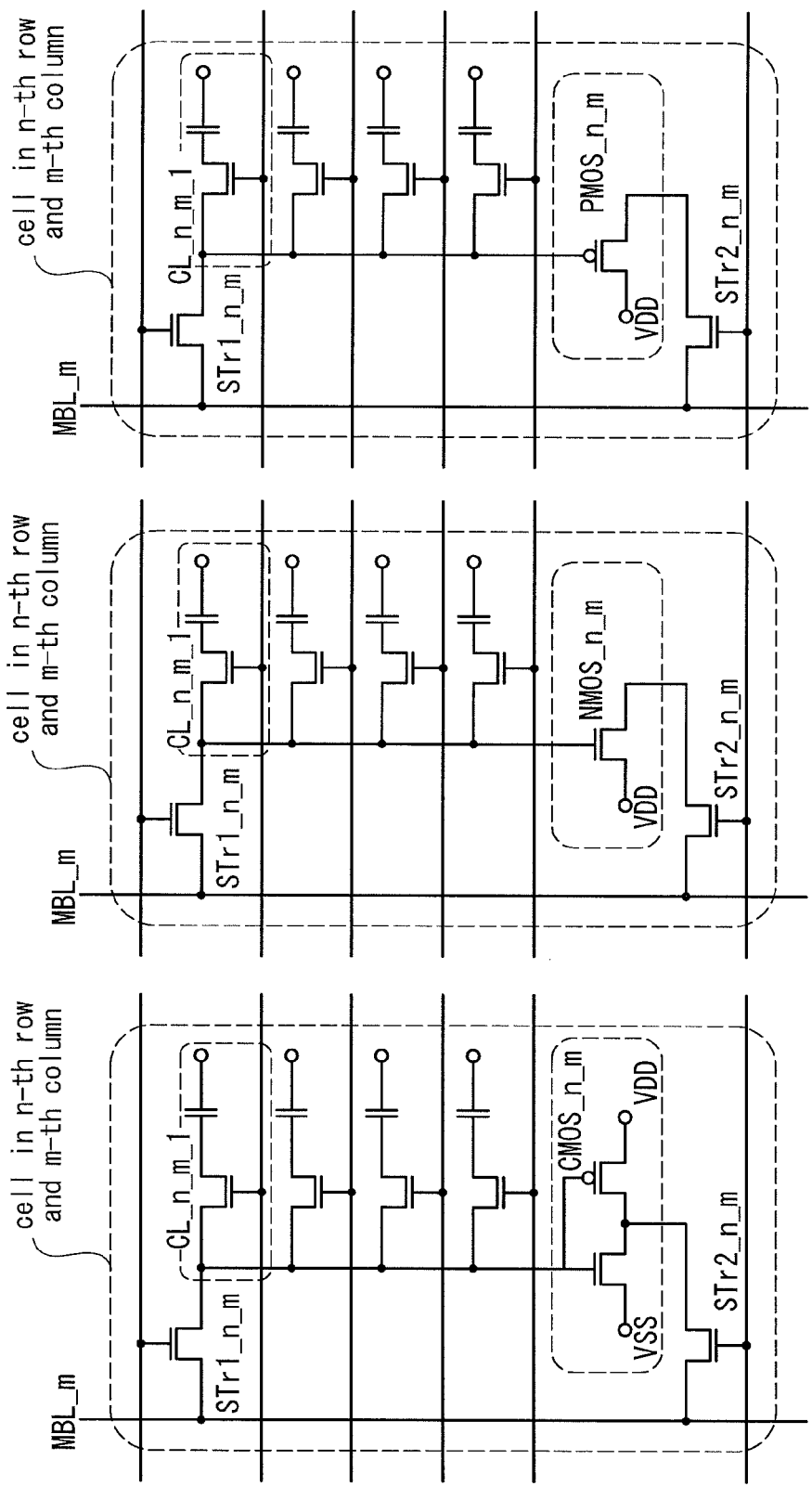

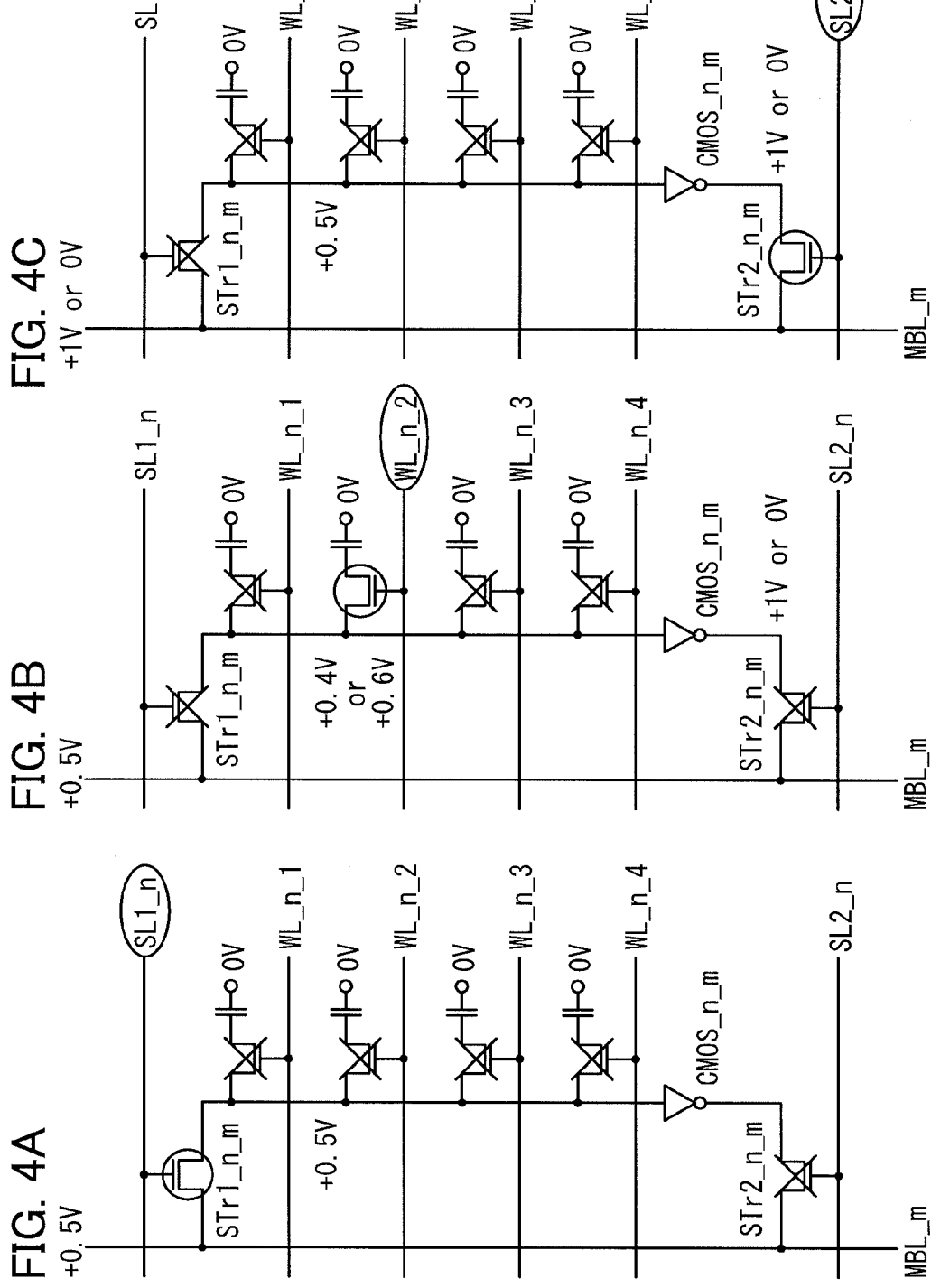

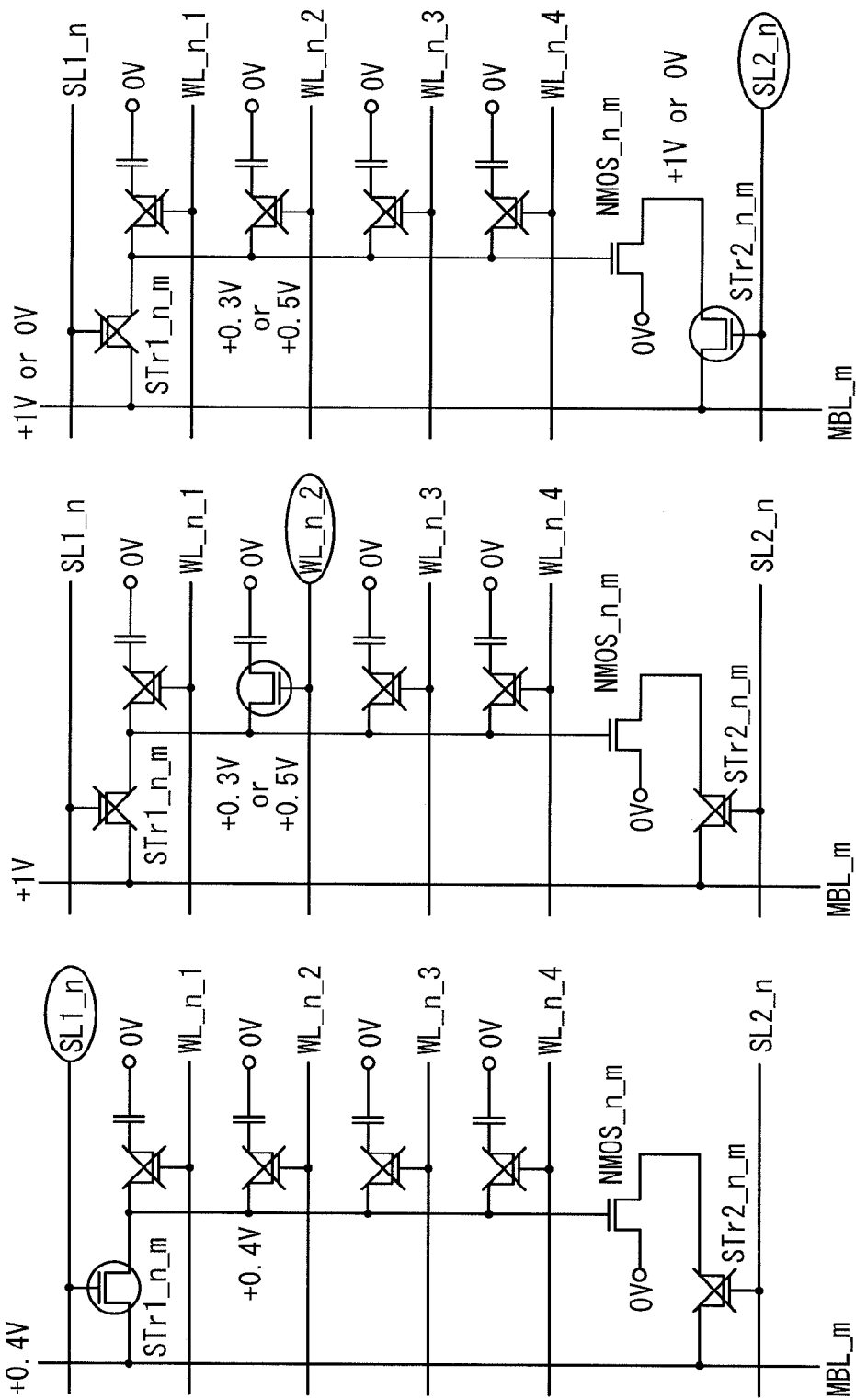

PRIOR ART

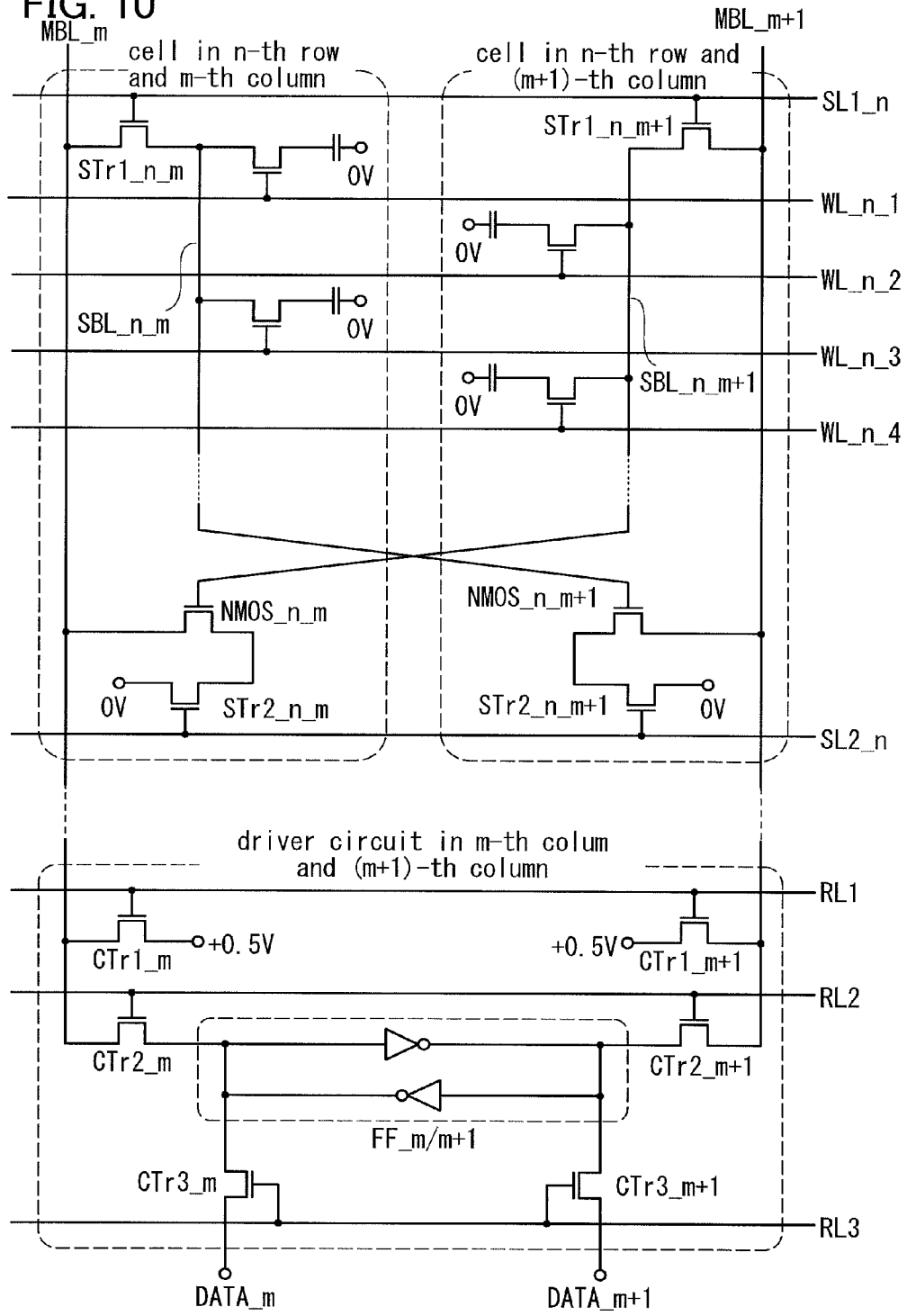

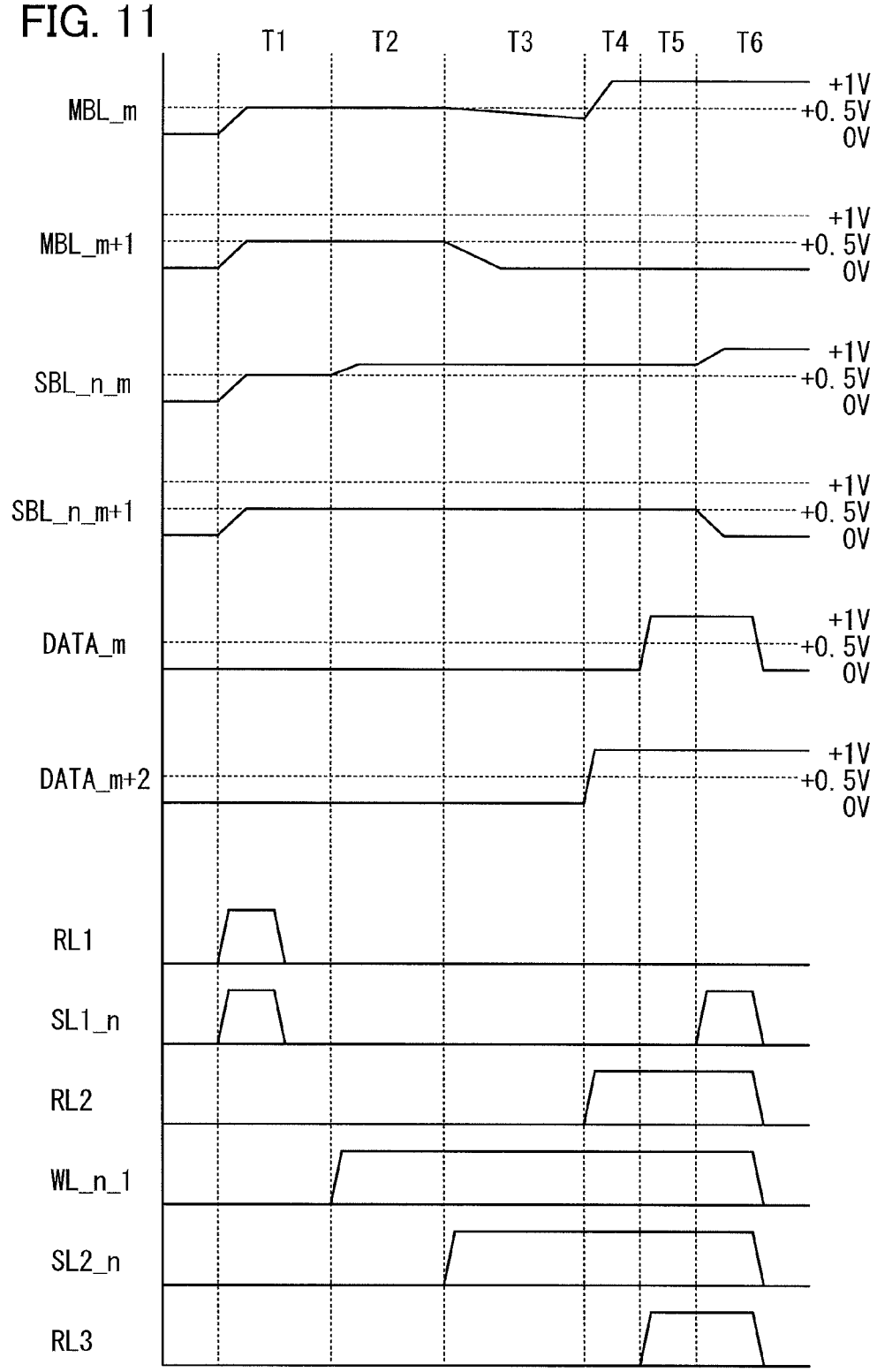

SEMICONDUCTOR MEMORY DEVICE AND METHOD FOR DRIVING THE SAME

BACKGROUND OF THE INVENTION

1. Field of the Invention

The present invention relates to a memory device using a semiconductor.

2. Description of the Related Art

Terms used in this specification will be briefly explained. First, when one of a source and a drain of a transistor is called a drain, the other is called a source in this specification. That is, they are not distinguished depending on the potential level. Therefore, a portion called a source in this specification can be alternatively referred to as a drain.

Further, even when it is written in this specification that "to be connected", there is a case in which no physical connection is made in an actual circuit and a wiring is only extended. For example, in an insulated-gate field-effect transistor (hereinafter simply referred to as a transistor) circuit, there is a case in which one wiring serves as gates of a plurality of transistors. In this case, one wiring may have a plurality of branches to gates in a circuit diagram. In this specification, the expression "a wiring is connected to a gate" is also used to describe such a case.

Note that in this specification, in referring to a specific row, a specific column, or a specific position in a matrix, a reference sign is accompanied by a sign denoting coordinates as follows, for example: "a first selection transistor $STr1\_n\_m$", "a bit line $MBL\_m$", and "a sub bit line $SBL\_n\_m$". In the case where a row, a column, or a position is not specified, the case where elements are collectively referred to, or the case where the position is obvious, the following expressions may be used: "a first selection transistor STr1", "a bit line MBL", and "a sub bit line SBL" or simply "a first selection transistor", "a bit line", and "a sub bit line".

A DRAM whose memory cell includes one transistor and one capacitor can be highly integrated, have no limit on the number of times of writing, and can perform writing and reading at relatively high speed; thus, such a DRAM is used in many kinds of electronic appliances. A DRAM stores data by accumulating electric charge in a capacitor of each memory cell, and reads the data by releasing the electric charge.

A conventional DRAM circuit is illustrated in FIG. 9. Similarly to the cases of other memory devices, memory cells are arranged in matrix. In FIG. 9, six memory cells in the n-th to the (n+5)-th rows and the m-th and the (m+1)-th columns and a driver circuit for reading are illustrated.

Hereinafter, the operation is briefly described. Data is written in the memory cells in the n-th row in the following manner. The potential of a word line $WL\_n$ is set to an appropriate potential (e.g., +1.8 V), so that transistors of the memory cells in the n-th row are turned on. Then, the potential of a bit line MBL such as a bit line $MBL\_n$ or a bit line $MBL\_m+1$ is set to a potential (e.g., +1 V or 0 V) in accordance with data. This operation can be performed by setting of the potential of a data input/output terminal DATA of the driver circuit in FIG. 9. A capacitor of each memory cell is charged to the potential.

Data reading is more complex when compared to data writing. First, the potentials of all the bit lines MBL, including the bit lines $MBL\_m$ and $MBL\_m+1$, are charged (precharged) to an appropriate potential (e.g., +0.5 V). This operation is performed by turning a first column transistor CTr1 on by controlling the potential of a first column driver line RL1 of the driver circuit in FIG. 9. The potential of a source of the first column transistor CTr1 is +0.5 V and a drain thereof is connected to the bit line MBL, whereby the bit line MBL is precharged to +0.5 V.

Both a high potential and a low potential of a power supply potential of the flip-flop circuit FF connected to the bit line MBL are set to +0.5 V. Note that a flip-flop circuit $FF\_m/m+1$ functions as a sense amplifier which amplifies a potential difference between the bit line $MBL\_m$ and the bit line $MBL\_m+1$. Flip-flop circuits are broadly used as sense amplifiers of DRAMs.

In that state, the potential of the word line in a row where reading is performed is controlled to be an appropriate potential, so that a transistor of the memory cell in the row is turned on. Accordingly, the potential of the bit line changes in accordance with the potential of the capacitor of the memory cell. For example, in order to perform reading of a memory cell in the (n+2)-th row, a word line $WL\_n+2$ is set to the above potential.

In the case where a capacitor of a memory cell $CL\_(n+2)\_m$ in the n+2-th row and the m-th column is charged to +1 V, the potential of the bit line $MBL\_m$ becomes higher than +0.5 V, e.g., +0.6 V. In the case where the capacitor is charged to 0 V, the potential of the bit line $MBL\_m$ becomes lower than +0.5 V, e.g., +0.4 V. On the other hand, in the bit line $MBL\_m+1$, there is no memory cell connected to the word line $WL\_n+2$; thus, the potential of the bit line $MBL\_m+1$ remains at +0.5 V.

In that state, the power supply potentials of the flip-flop circuit FF are set to predetermined values. For example, the high power supply potential is set to +1 V and the low power supply potential is set to 0 V here. The flip-flop circuit FF has a function of enlarging a difference between input potentials. For example, when the potential of a first terminal of the flip-flop circuit FF is higher than the potential of a second terminal of the flip-flop circuit FF, in the above condition, the potential of the first terminal becomes +1 V and that of the second terminal becomes 0 V.

Accordingly, when the potential of the bit line $MBL\_m$ is higher than +0.5 V, the potential of a terminal of the flip-flop circuit $FF\_m/m+1$ which is connected to the bit line $MBL\_m$ becomes +1 V, and the potential of a terminal of the flip-flop circuit $FF\_m/m+1$ which is connected to the bit line $MBL\_m+1$ becomes 0 V. On the contrary, when the potential of the bit line $MBL\_m$ is lower than +0.5 V, the potential of the terminal of the flip-flop circuit $FF\_m/m+1$ which is connected to the bit line $MBL\_m$ becomes 0 V, and the potential of the terminal of the flip-flop circuit $FF\_m/m+1$ which is connected to the bit line $MBL\_m+1$ becomes +1 V.

Since the bit line $MBL\_m$ is connected to the data input/output terminal $DATA\_m$, data stored in a memory cell can be read by reading the potential of the data input/output terminal $DATA\_m$. A problem in the above operation is reading accuracy. When parasitic capacitance (which is shown as $CS\_m$ or $CS\_m+1$) of the bit line MBL is sufficiently smaller than the capacitance of the capacitor of the memory cell where reading is performed, the potential of the bit line MBL is substantially the same as the potential of the capacitor.

On the contrary, when the parasitic capacitance of the bit line MBL is larger than the capacitance of the capacitor of the memory cell, the potential of the bit line MBL becomes less likely to be affected by the potential of the capacitor. For example, if the parasitic capacitance of the bit line MBL is ten times as large as the capacitance of the capacitor, potential change is only approximately 0.05 V when electric charge accumulated in the capacitor is released to the bit line MBL by turning a transistor of the memory cell on.

The possibility of errors in the flip-flop circuit FF becomes higher as difference between input potentials becomes smaller. The bit line MBL, which intersects with many wirings, has larger parasitic capacitance as its length becomes longer. As the capacitance of the capacitor becomes relatively smaller than the parasitic capacitance of the bit line MBL, potential change becomes smaller; thus, errors easily occur at the time of reading.

Although the size of a memory cell tends to be reduced as miniaturization proceeds, the capacitance of a capacitor of the memory cell cannot be reduced because a predetermined ratio of the capacitance of the capacitor to the parasitic capacitance of a bit line needs to be kept in the above-described manner. In other words, while an area in which a capacitor is formed is reduced, the capacitor has been needed to have the same capacitance as a conventional capacitor.

At present, a capacitor is formed to have a trench structure in which a deep hole is formed in a silicon wafer or a stack structure in which a chimney-like projection is provided (see Non Patent Documents 1 and 2). Both the hole and the projection are needed to have an aspect ratio of 50 or more. That is, an extremely long and narrow structure body whose depth or height is 2 μm or more needs to be formed in a limited area, which is difficult to realize with high yield.

In order to overcome such a difficulty, a method is disclosed in which bit lines are provided with sub bit lines and a sense amplifier of a flip-flop circuit type is connected to each of the sub bit lines so that the capacitance of a capacitor is reduced (see Patent Document 1). However, the present inventor found that the semiconductor memory device disclosed in Patent Document 1 cannot stably operate and a malfunction easily occurs when capacitance (including parasitic capacitance), examples of which are the capacitance of a sub bit line, the capacitance of a capacitor connected to the sub bit line, and the capacitance of input of a flip-flop circuit, is 1 fF or less.

Such a malfunction is mainly caused by noise. For example, a case is considered where the potential of a circuit is changed by some noise. Potential change in a circuit is inversely proportional to the capacitance of the circuit. That is, when the same amount of potential change caused by noise is assumed, potential change caused by the noise can be ignored in the case where the capacitance of the circuit is large, but the potential greatly changes due to the noise in the case where the capacitance of the circuit is small.

In a usual DRAM, the capacitance of a bit line is several hundred fF or more. Thus, potential change of the bit line is limited even with very large noise. On the other hand, in a sub bit line the capacitance of which is 1 fF, a potential change as large as 0.1 V or more is caused by noise which would cause a potential change as small as 1 mV in a usual bit line. In a sub bit line the capacitance of which is 0.1 fF or less, potential change is as large as 1 V or more.

In many cases, such noise occurs in a short time and an adverse effect of such noise can be removed by accumulating data for a long time and averaging the data. However, when a flip-flop circuit or the like is incorporated, an adverse effect of noise comes to the surface. This is because the flip-flop circuit is a positive feedback circuit in which output of a first inverter is input of a second inverter and output of the second inverter is input of the first inverter.

In a positive feedback circuit, once predetermined potential difference is observed, even if the potential difference is temporary, the potential difference is amplified and fixed thereafter. That is, noise (mainly, thermal noise) which does not cause a problem in a usual DRAM causes a malfunction in a semiconductor memory device including a sub bit line whose capacitance is extremely small. Thus, the DRAM disclosed in Patent Document 1 cannot be used in the case where the capacitance of a capacitor is very small.

Further, when the capacitance of a capacitor is 10 fF or less, influence of the capacitance (which refers to, specifically, the capacitance of a gate of a transistor connected to an input terminal or the like, and is usually 1 fF or smaller, although dependent on the size of the transistor) of the input of the flip-flop circuit that is used for a sense amplifier cannot be ignored.

The potential of a bit line (or a sub bit line) changes by release of electric charge which is accumulated in a capacitor to the bit line (or the sub bit line). Potential change in the bit line (or the sub bit line) is caused also by change in the gate capacitance of a transistor in a flip-flop circuit, which is turned on/off during operation of the flip-flop circuit.

In the case of a usual DRAM, the capacitance of a capacitor is much larger than the capacitance of the input of the flip-flop circuit. Thus, it can be considered that change in the potential of the bit line is largely due to the capacitor. However, when the capacitance of the capacitor is ten or less times as large as the capacitance of the input of the flip-flop circuit, the flip-flop circuit is influenced by its gate capacitance and operation becomes unstable. Specifically, in a condition where the capacitance of the capacitor is two or less times as large as the capacitance of the input of the flip-flop circuit, it is almost impossible to control the flip-flop circuit in accordance with the capacitance of the capacitor.

Further, in a conventional semiconductor memory device including a sub bit line, for its structure in which off current of a transistor of a memory cell cannot be sufficiently reduced, a reduction in the capacitance of a capacitor simply causes a problem of an increase in the frequency of refreshing. For example, when the capacitance of the capacitor is 1 fF, which is one thirtieth of conventional capacitance, the frequency of refreshing needs to be 30 times as high as the conventional frequency of refreshing, in which case more power is consumed.

REFERENCE

Patent Document

[Patent Document 1] U.S. Pat. No. 4,777,625

Non-Patent Document

[Non-Patent Document 1] K. Kim, "Technology for sub-50 nm DRAM and NAND flash manufacturing", *Technical Digest of International Electron Devices Meeting*, pp. 333-336, 2005.

[Non-Patent Document 2] W. Muller et al., "Challenges for the DRAM cell scaling to 40 nm", *Technical Digest of International Electron Devices Meeting*, pp. 347-350, 2005.

SUMMARY OF THE INVENTION

An object of one embodiment of the present invention is to provide a memory device which sufficiently functions even when the capacitance of a capacitor is smaller than or equal to that in a conventional DRAM, specifically 1 fF or less, preferably 0.1 fF or less. An object of one embodiment of the present invention is to provide a memory device which sufficiently functions even when the capacitance of a capacitor is ten or less times as large as the gate capacitance of a transistor used, preferably two or less times as large as the gate capacitance of the transistor used. Further, an object of one embodiment of the present invention is to provide a memory device in which a depth or a height necessary for a capacitor is 1 µm or less, preferably 0.3 µm or less.

Further, an object of one embodiment of the present invention is to provide a memory device having a novel structure or a method for driving the memory device. Specifically, an object of one embodiment of the present invention is to provide a memory device in which power consumption can be reduced or a method for driving a memory device, in which power consumption can be reduced.

One embodiment of the present invention is a semiconductor memory device including one or more bit lines, four or more word lines, and two or more cells. Each of the cells includes two or more memory cells, a sub bit line, a first selection transistor, a second selection transistor, and an amplifier circuit. A drain of the first selection transistor is connected to a first bit line. A source of the first selection transistor and a first terminal of the amplifier circuit are connected to the sub bit line. A second terminal of the amplifier circuit is connected to a source of the second selection transistor. A drain of the second selection transistor or a third terminal of the amplifier circuit is connected to the first bit line or the other bit line. Each of the memory cells includes one or more transistors and one or more capacitors. The capacitance of the capacitor is 1 fF or less. A gate, a drain, and a source of one of the transistors of each of the memory cells are connected to one of the word lines, the sub bit line, and one electrode of the capacitor, respectively.

One embodiment of the present invention is a semiconductor memory device including one or more bit lines, four or more word lines, one or more first selection lines parallel to the word line, one or more second selection lines parallel to the word line, and two or more cells. Each of the cells includes two or more memory cells, a sub bit line, a first selection transistor, a second selection transistor, and an amplifier circuit. A drain of the first selection transistor is connected to a first bit line. A gate of the first selection transistor and a gate of the second selection transistor are connected to one of the first selection lines and one of the second selection lines, respectively. A source of the first selection transistor and a first terminal of the amplifier circuit are connected to the sub bit line. A second terminal of the amplifier circuit is connected to a source of the second selection transistor. A drain of the second selection transistor or a third terminal of the amplifier circuit is connected to the first bit line or the other bit line. Each of the memory cells includes one or more transistors and one or more capacitors. The capacitance of the capacitor is 1 fF or less. A gate of one of the transistors included in each of the memory cells is connected to one of the word lines.

One embodiment of the present invention is a method for driving a memory device including one or more bit lines, four or more word lines, and two or more cells. Each of the cells includes two or more memory cells, a sub bit line, a first selection transistor, a second selection transistor, and an amplifier circuit. A drain of the first selection transistor is connected to one of the bit lines. A source of the first selection transistor and a first terminal of the amplifier circuit are connected to the sub bit line. A second terminal of the amplifier circuit is connected to a source of the second selection transistor. Each of the memory cells includes one or more transistors and one or more capacitors. The capacitance of the capacitor is 1 fF or less. A gate, a drain, and a source of one of the transistors of each of the memory cells are connected to one of the word lines, the sub bit line, and one electrode of the capacitor, respectively. The method for driving the memory device includes a first step of setting the potential of the sub bit line to a specific potential by turning the first selection transistor on, and a second step of turning one of the transistors of one of the memory cells on.

In the above, the first selection transistor and one of the transistors of one of the memory cells in one cell may be provided in different layers. Further, a semiconductor used in the first selection transistor and a semiconductor used in one of the transistors of one of the memory cells in one cell may be of different kinds. In the above, one of the transistors of one of the memory cells and one of the transistors of the other memory cell are provided in different layers in one cell.

In the above, the amplifier circuit may be a circuit (e.g., a complementary inverter) including one to three transistors. Further, the amplifier circuit may be one n-channel transistor or one p-channel transistor. Moreover, one cell may include 4 to 64 memory cells. Furthermore, a necessary depth or a necessary height for the capacitor may be 1 µm or less, preferably 0.3 µm or less.

By employing any of the above-described structures, at least one of the above-described objects can be achieved. An effect of one embodiment of the present invention will be described with reference to FIG. 1. A circuit illustrated in FIG. 1 is part of the technical idea of the present invention. In FIG. 1, four cells in the n-th and the (n+1)-th rows and the m-th and the (m+1)-th columns are shown, where each of the cells includes four memory cells. Similarly to a conventional DRAM, each memory cell includes one transistor and one capacitor.

At the time of reading, a sub bit line SBL_n_m is set to a state where an appropriate potential is kept and a first selection transistor STr1_n_m is turned off. A transistor in a memory cell where reading is performed is turned on in this state, whereby the potential of the sub bit line SBL_n_m changes in accordance with electric charge accumulated in a capacitor of the memory cell.

The potential of the sub bit line SBL_n_m is amplified by an amplifier circuit AMP_n_m. Then, a second selection transistor STr2_n_m is turned on, whereby an output potential of the amplifier circuit AMP_n_m is output to the bit line MBL_m.

Here, the sub bit line SBL_n_m is sufficiently short and its parasitic capacitance is thus sufficiently small as compared to the parasitic capacitance of the bit line MBL_m. Thus, even when the capacitance of the capacitor of the memory cell is small, a signal can be amplified by the amplifier circuit AMP_n_m without a malfunction, and the amplified signal can be output to the bit line MBL_m.

It is needless to say that the amplified signal includes noise that is large when measured in an extremely short time; however, an adverse effect of the noise can be cancelled in a process of accumulating electric charge in the bit line MBL_m whose capacitance is sufficiently large. That is, a memory device having a function equivalent to a conventional DRAM and a smaller capacitor than the conventional DRAM can be manufactured.

Such a small capacitor makes it unnecessary to form a structure body with a high aspect ratio, which is included in a conventional DRAM. In a conventional DRAM, there is not only a problem of difficulty in manufacturing such a structure body, but also a problem of greater difficulty in improving the memory density by manufacturing a memory device having a multilayer structure with the use of those structure bodies. When one embodiment of the present invention in which such a structure body is not needed is utilized in view of the above problem, a multilayer technique in which a memory cell is stacked over a memory cell can be realized.

BRIEF DESCRIPTION OF THE DRAWINGS

In the accompanying drawings:

FIGS. 2A to 2C illustrate examples of the semiconductor memory device of the present invention;

FIGS. 4A to 4C illustrate an example of a method for driving the semiconductor memory device of the present invention;

FIGS. 5A to 5C illustrate an example of a method for driving the semiconductor memory device of the present invention;

FIG. 10 illustrates an example of a semiconductor memory device of the present invention;

FIG. 11 illustrates an example of a method for driving the semiconductor memory device of the present invention;

DETAILED DESCRIPTION OF THE INVENTION

Hereinafter, embodiments will be described with reference to drawings. However, the embodiments can be implemented in various modes. It will be readily appreciated by those skilled in the art that modes and details can be changed in various ways without departing from the spirit and scope of the present invention. Therefore, the present invention is not interpreted as being limited to the description of the embodiments below.

Embodiment 1

In this embodiment, a semiconductor memory device illustrated in FIG. 1 and an example of its operation are described with reference to FIGS. 2A to 2 C, FIGS. 3A and 3B, FIGS. 4A to 4C, and FIGS. 5A to 5C. Note that specific values are given below as potentials for the purpose of aid for understanding the technical idea of the present invention. Needless to say, such values are changed in accordance with various characteristics of a transistor, a capacitor, or the like, or for convenience of the practitioner. Further, the semiconductor memory device described in this embodiment can write or read data using a method other than a method described below.

Figure 1:
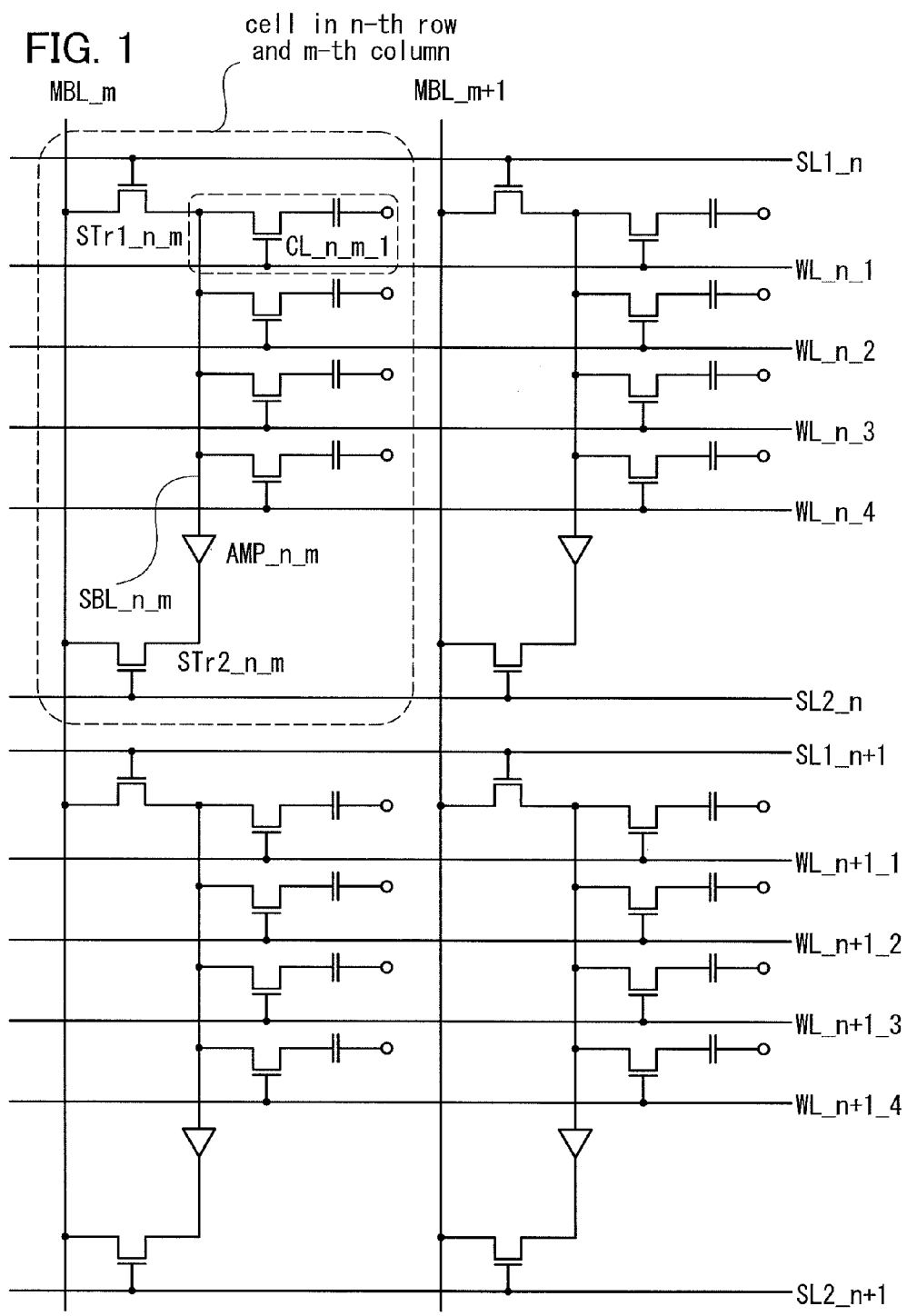
FIG. 1 illustrates an example of a semiconductor memory device of the present invention.

The semiconductor memory device illustrated in FIG. 1 includes word lines WL, bit lines MBL intersecting with the word lines, first selection lines SL1 and second selection lines SL2 which are parallel to the word lines WL, and a plurality of cells. Each cell includes a first selection transistor STr1, a second selection transistor STr2, a sub bit line SBL, an amplifier circuit AMP, and a plurality of memory cells CL. Although four memory cells CL are provided in each cell in FIG. 1, a larger number of memory cells may be provided.

The cell in the n-th row and the m-th column which is illustrated in FIG. 1 includes a memory cell CL_n_m_1, a memory cell CL_n_m_2, a memory cell CL_n_m_3, and a memory cell CL_n_m_4, from the top. Each memory cell includes one transistor and one capacitor similarly to a conventional DRAM, but may include two or more transistors or two or more capacitors. It is preferable that a drain of the transistor of the memory cell be connected to the sub bit line SBL, a source of the transistor be connected to one electrode of the capacitor, and a gate of the transistor be connected to one of the word lines WL.

Further, a drain of the first selection transistor STr1 and a drain of the second selection transistor STr2 are connected to the bit line MBL; a source of the first selection transistor STr1 and input of the amplifier circuit AMP are connected to the sub bit line SBL; output of the amplifier circuit AMP is connected to a source of the second selection transistor STr2; a gate of the first selection transistor STr1 is connected to one of the first selection lines; and a gate of the second selection transistor STr2 is connected to one of the second selection lines.

Any of a variety of semiconductors can be used for the first selection transistor STr1, the second selection transistor STr2, the transistor included in the memory cell CL, and a transistor used for the amplifier circuit AMP. For example, all those transistors can be formed using the same semiconductor material. For example, those transistors may be Ruined using a single crystal silicon semiconductor substrate.

Alternatively, the first selection transistor STr1, the second selection transistor STr2, and the transistor used for the amplifier circuit AMP may be manufactured using a single crystal silicon semiconductor substrate, and the transistor included in the memory cell CL may be formed using a semiconductor layer in a thin film shape. In that case, for the semiconductor layer in a thin film shape, single crystalline silicon, polycrystalline silicon, or a semiconductor other than silicon, an example of which is an oxide semiconductor, may be used.

Particularly in the case of an oxide semiconductor having a band gap of three electron volts or more, by making the concentration of donors or acceptors $1\times10^{12}$ cm$^{-3}$ or lower, the resistance in an off state can be extremely high. In other words, by optimizing the potential of a gate, the resistance between a source and a drain can be $1\times10^{24}\Omega$ or higher. For example, even when the capacitance of a memory cell is $1\times10^{-17}$ F, which is less than or equal to one thousandth of the capacitance of a memory cell of a conventional DRAM, a time constant is $1\times10^{7}$ seconds (115 days), and data can be held for a long period, which cannot be assumed in a conventional DRAM.

In other words, refreshing (rewriting of data for the purpose of compensating a reduction in electric charge accumulated in a capacitor) which needs to be performed ten or more times per second in a conventional DRAM becomes unnecessary in a usual usage.

At the time of data writing in a DRAM, much of current flowing in a bit line is used for charging and discharging of parasitic capacitance between the bit lines in addition to for charging of a capacitor of a memory cell. Since parasitic capacitance between the bit lines increases as the wiring width decreases, in the present situation of higher integration, current ten or more times as high as current needed for charging of the capacitor of the memory cell is used for charging and discharging of the parasitic capacitance between the bit lines.

Needless to say, charging and discharging of parasitic capacitance between the bit lines is a phenomenon not related to data holding, and performing refreshing leads an increase in power consumption. In view of that, a reduction in the number of times of refreshing or omission of refreshing is effective in suppressing power consumption.

Any of a variety of structures can be applied to the amplifier circuit AMP; in view of integration, a structure as easy as possible is preferably employed. For example, a complementary inverter CMOS using an n-channel transistor and a p-channel transistor, which is illustrated in FIG. 2A, an NMOS using only one n-channel transistor, which is illustrated in FIG. 2B, or a PMOS using only one p-channel transistor, which is illustrated in FIG. 2C, can be given.

The number of the memory cells CL included in one cell is four in FIG. 1 and the number of the memory cells CL included in one cell is preferably 4 to 64. As the number of the memory cells increases, the length of the sub bit line SBL increases, which leads larger parasitic capacitance. When the capacitance of the capacitor of the memory cell CL is constant, a ratio of the capacitance of the capacitor of the memory cell CL to parasitic capacitance of the sub bit line SBL decreases; thus, a malfunction at the time of amplifying a signal by the amplifier circuit AMP easily occurs.

On the other hand, in the case of forming the first selection transistors STr1, the second selection transistors STr2, and the amplifier circuits AMP over one plane, the semiconductor memory device is inferior to a conventional DRAM in terms of an integration degree for including those components. In view of the above, the number of the memory cells CL included in one cell is preferably 8 to 32.

Operation of the semiconductor memory device illustrated in FIG. 1 (or FIGS. 2A to 2C) is described with reference to FIGS. 3A and 3B, FIGS. 4A to 4C, and FIGS. 5A to 5C. Note that in FIGS. 3A and 3B, FIGS. 4A to 4C, and FIGS. 5A to 5C, a transistor in an off state is expressed by a transistor symbol overlapped with an x; a transistor in an on state is expressed by a transistor symbol overlapped with a circle; the first selection line SL1, the second selection line SL2, and the word line WL to which a potential (H) for turning a transistor connected thereto on is supplied are expressed by their reference signs with surrounding circles. Note that a potential for turning the transistors connected to the lines off is L.

First, writing operation will be described. For example, a case is considered where data is written in the second memory cell CL_n_m_2 in the cell in the n-th row and the m-th column. Note that the writing operation can be applied regardless of which of the circuits illustrated in FIGS. 2A to 2C is employed.

Figure 3A:
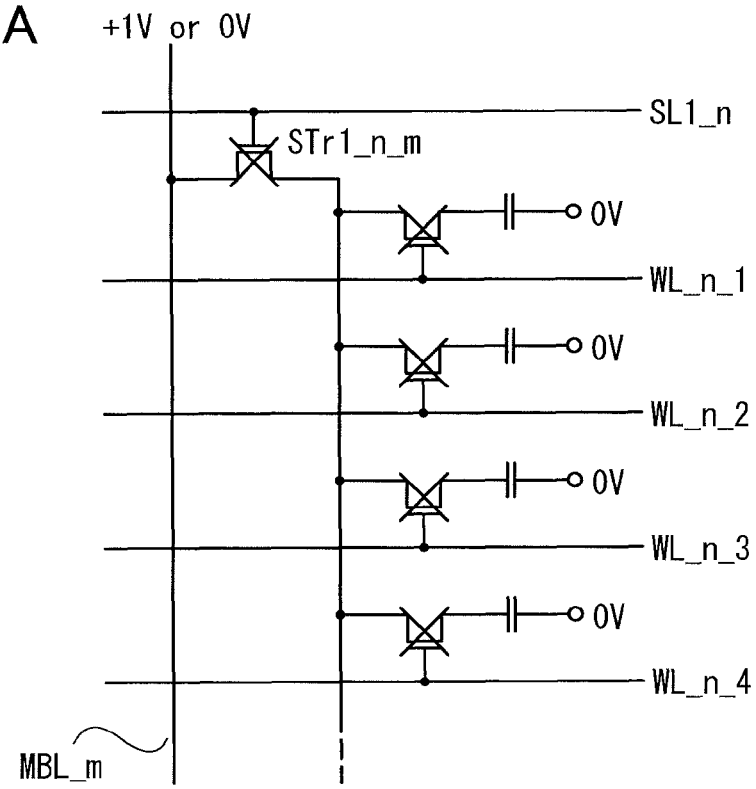
FIGS. 3A and 3B illustrate an example of a method for driving the semiconductor memory device of the present invention.

First, as illustrated in FIG. 3A, the potential of the bit line MBL_m is set to 0 V or +1 V depending on data. At this stage, all the transistors in the cell in the n-th row and the m-th column (including the second selection transistor STr2_n_m which is not shown) are off.

Figure 3B:
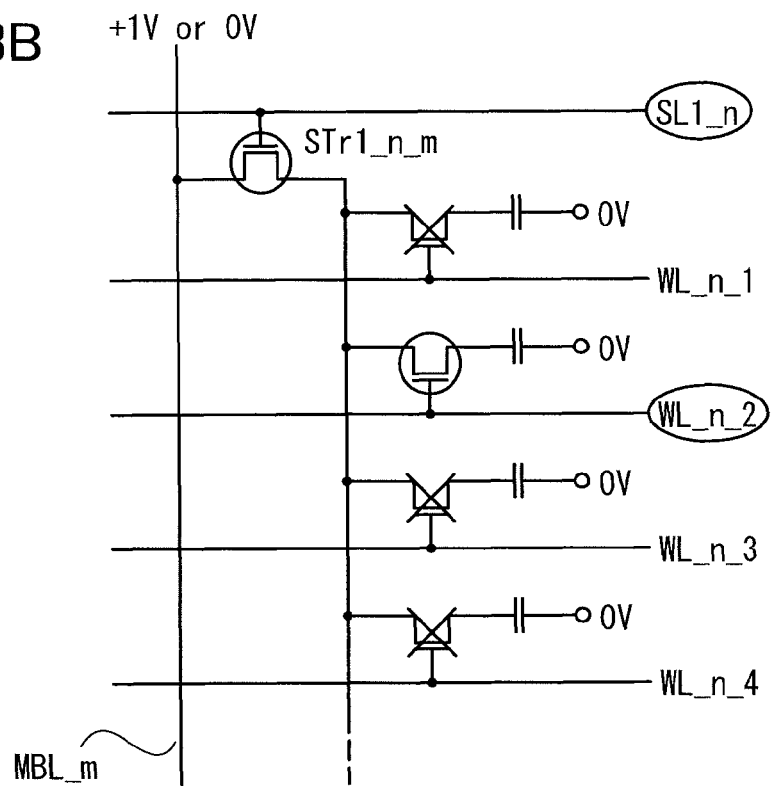

Then, as illustrated in FIG. 3B, the potentials of the first selection line SL1_n and the word line WL_n_2 are set to H, so that the first selection transistor STr1_n_m and the transistor of the memory cell CL_n_m_2 are turned on. As a result, the capacitor of the memory cell CL_n_m_2 is charged to the potential of the bit line MBL_m.

After charging is completed, the potentials of the first selection line SL1_n and the word line WL_n_2 are set to L, so that the first selection transistor STr1_n_m and the transistor of the memory cell CL_n_m_2 are turned off. Thus, data writing is completed.

Next, reading in the memory cell CL_n_m_2 is described. First, a case where the complementary inverter CMOS illustrated in FIG. 2A is used as the amplifier circuit AMP is described. Here, the complementary inverter CMOS outputs 0 V in the case where input is +0.6 V or higher, and outputs +1 V in the case where input is +0.4 V or lower.

Further, the capacitance of the capacitor of the memory cell CL_n_m_2 is one fourth of the sum of the parasitic capacitance of the sub bit line SBL_n_m and the capacitance (including the gate capacitance and parasitic capacitance) of the complementary inverter CMOS_n_m. Note that in manufacturing the memory device of this embodiment, the capacitance of the capacitor of the memory cell CL is preferably 20% or more of the sum of the parasitic capacitance of the sub bit line SBL and the capacitance (including the gate capacitance and parasitic capacitance) of the complementary inverter CMOS.

First, as illustrated in FIG. 4A, the potential of the bit line MBL_m is set to +0.5 V and the potential of the first selection line SL1_n is set to H, so that the first selection transistor STr1_n_m is turned on. As a result, the potential of the sub bit line SBL_n_m is +0.5 V.

Then, as illustrated in FIG. 4B, the potential of the first selection line SL1_n is set to L, so that the first selection transistor STr1_n_m is turned off. Further, the potential of the word line WL_n_2 is set to H, so that the transistor of the memory cell CL_n_m_2 is turned on. As a result, the potential of the sub bit line SBL_n_m changes.

Since the first selection transistor STr1_n_m is off, as for potential change, only the capacitance of the capacitor of the memory cell CL_n_m_2, the parasitic capacitance of the sub bit line SBL_n_m, and the capacitance of the complementary inverter CMOS_n_m may be considered here.

Since the capacitance of the capacitor of the memory cell CL_n_m_2 is one fourth of the sum of the parasitic capacitance of the sub bit line SBL_n_m and the capacitance of the complementary inverter CMOS_n_m as described above, the potential of the sub bit line SBL_n_m is either +0.4 V or +0.6 V. The potential of the sub bit line SBL_n_m is converted by the complementary inverter to be +1 V or 0 V.

After that, as illustrated in FIG. 4C, the potential of the second selection line SL2_n is set to H, so that the second selection transistor STr2_n_m is turned on. Note that when the transistor of the memory cell CL_n_m_2 is on, the potential of the sub bit line SBL_n_m is influenced by the potential of the word line WL_n_2 through the gate capacitance of the transistor.

This phenomenon becomes obvious when the sum of the capacitance of the capacitor, the parasitic capacitance of the sub bit line SBL_n_m, and the capacitance of the complementary inverter CMOS_n_m is five or less times as large as the gate capacitance of the transistor of the memory cell CL_n_m_2; thus, especially when the capacitance of the capacitor is smaller than or equal to the gate capacitance of the transistor of the memory cell CL_n_m_2, the potential of the word line WL_n_2 is preferably set to L, so that the transistor of the memory cell CL_n_m_2 is turned off.

Output of the complementary inverter CMOS_n_m is output to the bit line MBL_m through the second selection transistor STr2_n_m. Since change in the potential of the bit line MBL_m is sufficiently large, the potential change can be determined without using a sense amplifier.

Next, a reading method in an example where the n-channel transistor NMOS illustrated in FIG. 2B is used as the amplifier circuit AMP is described. Here, threshold voltage of the n-channel transistor NMOS_n_m is +0.4 V, and when the potential of a gate is +0.5 V, current which is one hundred times as high as current which flows when the potential of the gate is +0.3 V flows between a source and a drain (i.e., the resistance between the source and the drain is one hundredth).

Note that the source of the n-channel transistor NMOS_n_m is kept at 0 V, and the drain is connected to the source of the second selection transistor STr2_n_m. Further, the capacitance of the capacitor of the memory cell CL_n_m_2 is one fourth of the sum of the parasitic capacitance of the sub bit line SBL_n_m and the capacitance (including the gate capacitance and parasitic capacitance) of the n-channel transistor NMOS_n_m.

First, as illustrated in FIG. 5A, the potential of the bit line MBL_m is set to +0.4 V and the potential of the first selection line SL1_n is set to H, so that the first selection transistor STr1_n_m is turned on. As a result, the potential of the sub bit line SBL_n_m becomes +0.4 V.

Then, as illustrated in FIG. 5B, the potential of the first selection line SL1_n is set to L, so that the first selection transistor STr1_n_m is turned off. Further, the bit line MBL_m is precharged to +1 V. Further, the potential of the word line WL_n_2 is set to H, so that the transistor of the memory cell CL_n_m_2 is turned on. As a result, the potential of the sub bit line SBL_n_m changes.

Since the first selection transistor STr1_n_m is off, as for potential change, only the capacitance of the capacitor of the memory cell CL_n_m_2, the parasitic capacitance of the sub bit line SBL_n_m, and the capacitance of the n-channel transistor NMOS_n_m may be considered here.

Since the capacitance of the capacitor of the memory cell CL_n_m_2 is one fourth of the sum of the parasitic capacitance of the sub bit line SBL_n_m and the capacitance of the n-channel transistor NMOS_n_m as described above, the potential of the sub bit line SBL_n_m is either +0.3 V or +0.5 V.

Then, as illustrated in FIG. 5C, the potential of the second selection line SL2_n is set to H, so that the second selection transistor STr2_n_m is turned on. Note that, here, the potential of the word line WL_n_2 is preferably set to L, so that the transistor of the memory cell CL_n_m_2 is turned off.

When the potential of the sub bit line SBL_n_m is +0.5 V, positive electric charge of the bit line MBL_m is absorbed at speed which is one hundred times as high as that in the case where the potential of the sub bit line SBL_n_m is +0.3 V; thus, the potential of the bit line MBL_m drastically decreases. On the other hand, the potential slowly decreases when the potential of the sub bit line SBL_n_m is +0.3 V.

Thus, after an appropriate period T is passed, the potential of the bit line MBL_m can be set to either a value (e.g., +0.96 V) which can be seen as substantially +1 V or a value (e.g., +0.02 V) which can be seen as substantially 0 V.

In such a case, the potential of the bit line MBL_m can be determined without using a sense amplifier. The period T may be decided in consideration of the parasitic capacitance of the bit line MBL_m, and on resistance when the potential of the gate of the n-channel transistor NMOS_n_m is set to +0.5 V.

For example, the period T is preferably four to ten times as large as a time constant calculated from the parasitic capacitance of the bit line MBL_m and the on resistance of the n-channel transistor NMOS_n_m. When the potential of the bit line MBL_m can be more minutely measured, it is possible to distinguish data even in the case where the period T is 0.7 to 60 times as large as the above time constant. It needs to be noted that after sufficiently long time passes, regardless of the potential of the sub bit line SBL_n_m, the potential of the bit line MBL_m decreases so much as to be impossible to determine.

Note that in the above example, the parasitic capacitance of the sub bit line SBL_n_m is larger than the capacitance of the capacitor of the memory cell CL_n_m_2, and thus potential change of the sub bit line SBL_n_m due to electric charge accumulated in the capacitor of the memory cell CL_n_m_2 becomes as small as ±0.1 V; the potential change can be made larger by increasing the capacitance of the capacitor of the memory cell CL_n_m_2, or by reducing the parasitic capacitance of the sub bit line SBL_n_m. In that case, the period T can be 0.7 or less times as large as the above time constant; alternatively, the period T can be 60 or more times as large as the above time constant.

The present invention is not limited to the above reading method; an end of the bit line MBL_m may be connected to one terminal of a resistor having an appropriate resistance $R_M$. Here, the resistance $R_M$ is between a resistance $R_L$ between the source and drain when the potential of the gate of the n-channel transistor NMOS_n_m is +0.5 V and a resistance $R_H$ between the source and drain when the potential of the gate of the n-channel transistor NMOS_n_m is +0.3 V (i.e., $R_L < R_M < R_H$). In an example described below, $R_M = R_H/10$ and $R_M = 10 R_L$. The potential of the other terminal of the resistor is set to +1 V.

In that case, the bit line MBL_m does not need to be precharged to +1 V, and a potential $V_R$ at a connection point of the bit line MBL_m and the resistor may be measured. When the potential of the sub bit line SBL_n_m is +0.5 V, the resistance of the n-channel transistor NMOS_n_m is $R_L$, and thus the potential $V_R$ is +0.09 V. Further, when the potential of the sub bit line SBL_n_m is +0.3 V, the resistance of the n-channel transistor NMOS_n_m is $R_H$, and thus the potential $V_R$ is +0.91 V.

In that case, the potential does not change depending on the measurement time. A similar circuit can be formed also in the case where an n-channel transistor or a p-channel transistor is used instead of the resistor. For example, it is preferable that a source of an n-channel transistor having substantially the same size as the n-channel transistor NMOS_n_m be connected to the bit line MBL_m, the potential of a drain of the n-channel transistor be set to +1 V, and the potential of a gate of the n-channel transistor be set to +0.4 V.

Although the n-channel transistor NMOS is used as the amplifier circuit AMP in the above example, the p-channel transistor PMOS illustrated in FIG. 2C can be alternatively used.

Embodiment 2

An example of a method for manufacturing a semiconductor memory device according to part of the technical idea of the present invention is described with reference to FIGS. 6A to 6C, FIGS. 7A and 7B, and FIG. 8. Note that FIGS. 6A to 6C, FIGS. 7A and 7B, and FIG. 8 show cross sections of the semiconductor memory device following a process for manufacturing the semiconductor memory device; the cross sections do not show the cross-sections of a specific part.

First, by a known semiconductor processing technique, an element separation insulator 102, a p-well 101P, and an n-well 101N are formed over one surface of a substrate 101 which is formed of a single crystal semiconductor such as silicon, gallium arsenide, gallium phosphide, silicon carbide, germanium, or germanium silicide. Further, a gate 104N of an n-channel transistor, an n-type impurity region 103N, a gate 104P of a p-channel transistor, and a p-type impurity region 103P are formed. In addition, a first interlayer insulator 105 is formed and first contact plugs 106a to 106d are formed (see FIG. 6A).

Figure 6A:
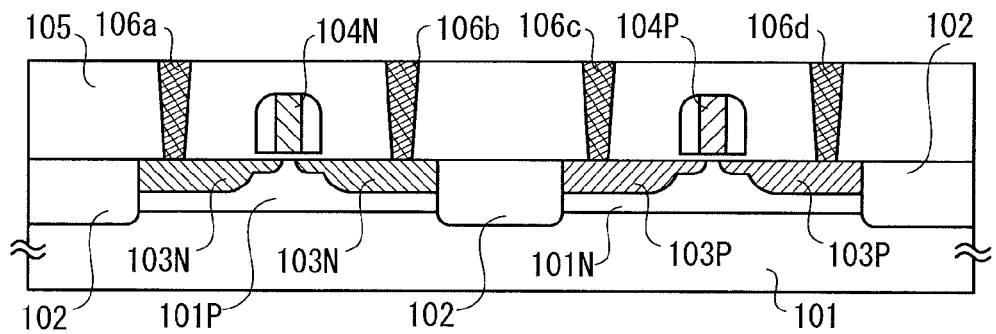
FIGS. 6A to 6C illustrate an example of a process for manufacturing a semiconductor memory device of the present invention.
Figure 6B:
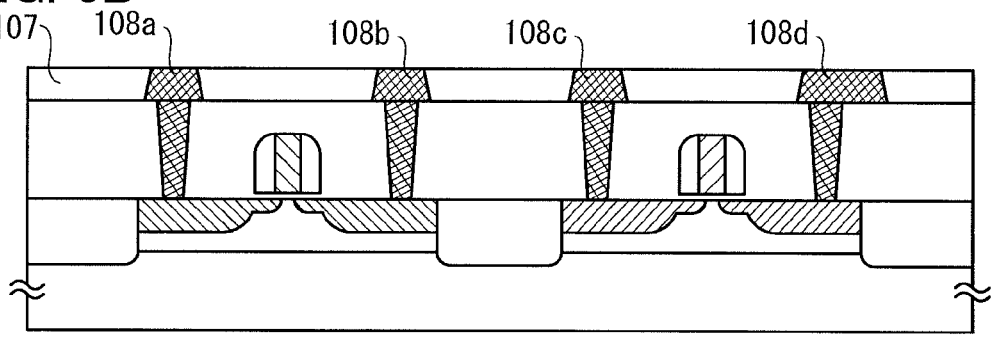
Figure 6C:
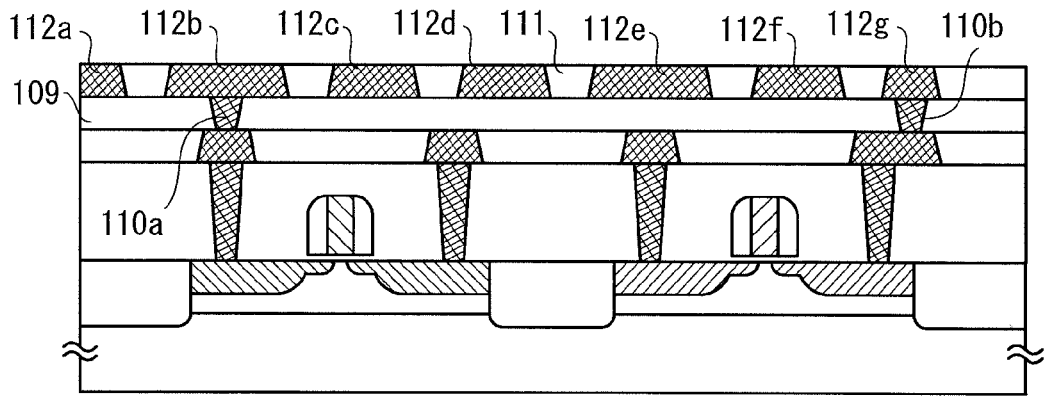

Then, a first embedded insulator 107 and first layer wirings 108a to 108d are formed (see FIG. 6B). For the first layer wirings 108a to 108d, copper may be used for an increase in conductivity. In that case, the first layer wirings 108a to 108d are preferably manufactured by a damascene method. Through the above steps, the first selection transistor STr1, the second selection transistor STr2, and the amplifier circuit AMP can be formed.

After that, a second interlayer insulator 109 is formed, and second contact plugs 110a and 110b are formed therein. Further, a second embedded insulator 111 and second layer wirings 112a to 112g are formed (see FIG. 6C). Here, top surfaces of the second layer wirings 112a to 112g are in direct contact with an oxide semiconductor to be formed later or are in contact with the oxide semiconductor with a thin insulator provided therebetween; thus, the second layer wirings are preferably formed using a material suitable for the purpose. For example, it is preferable to use a material whose work function is smaller than the electron affinity of the oxide semiconductor, such as titanium or titanium nitride. The height (thickness) of each of the second layer wirings 112a to 112g may be 50 nm to 500 nm.

Further, an insulator 113 for a capacitor is formed to a thickness of 6 nm to 20 nm. In the insulator for a capacitor, opening portions reaching the second layer wirings 112b and 112e are formed. The capacitance of a capacitor of a memory cell is determined with the thickness and dielectric constant of the insulator 113 for a capacitor. When the insulator 113 for a capacitor is thin, the capacitance of the capacitor is large, but at the same time, leakage current is also large. Since an increase in leakage current degrades data retention characteristics of the memory cell, the thickness of the insulator 113 for a capacitor is preferably 10 nm or more. As a material for the insulator 113 for a capacitor, silicon oxide, silicon oxynitride, aluminum oxide, hafnium oxide, zirconium oxide, or the like can be used.

Then, oxide semiconductor layers 114a and 114b are formed. As the oxide semiconductor, an oxide semiconductor in which indium account for 20 at. % or more of all metal elements is preferably used. At the time of formation, attention needs to be paid to prevent mixture of hydrogen, and deposition of the oxide semiconductor is preferably performed by a sputtering method with hydrogen and water in an atmosphere or a target sufficiently reduced. The thickness of each of the oxide semiconductor layers 114a and 114b may be 1 nm to 20 nm.

Further, a gate insulator 115 is formed. As a material for the gate insulator 115, silicon oxide, silicon oxynitride, aluminum oxide, hafnium oxide, zirconium oxide, or the like can be used. The thickness of the gate insulator 115 is preferably 6 nm to 20 nm, more preferably 10 nm to 16 nm.

Figure 7A:
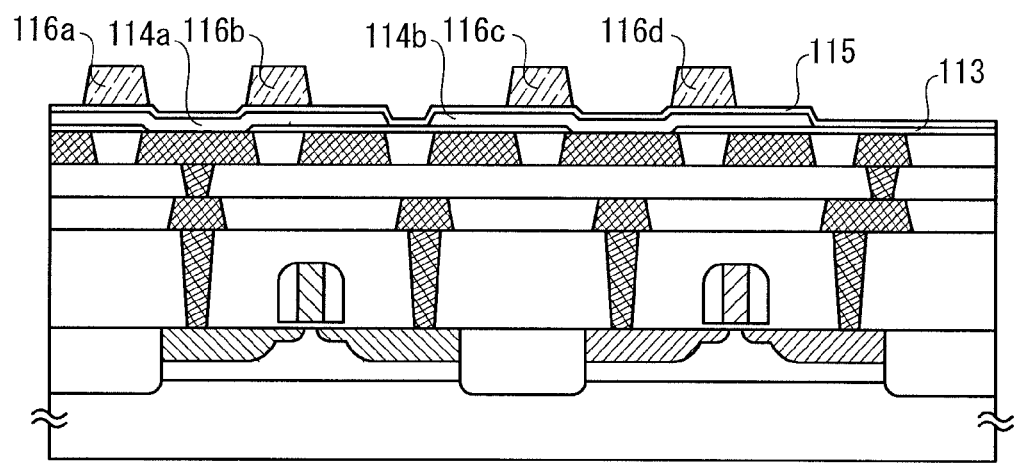
FIGS. 7A and 7B illustrate the example of the process for manufacturing the semiconductor memory device of the present invention.

After that, word lines 116a to 116d are formed (see FIG. 7A). As a material for the word lines 116a to 116d, a material whose work function is larger than the electron affinity of the oxide semiconductor, such as tungsten, tungsten nitride, indium nitride, zinc nitride, or platinum is preferably used. Alternatively, only part of the word lines 116a to 116d, which is in contact with the gate insulator 115 may be formed of such a material.

From the above steps, a first memory cell layer can be formed. In FIG. 7A, four memory cells are illustrated. The four memory cells are memory cells including transistors whose gates are the word lines 116a to 116d.

Here, the memory cell including the transistor whose gate is the word line 116d is described. The transistor of this memory cell is formed using a right half of the oxide semiconductor layer 114b. The second layer wiring 112f is a counter electrode of a capacitor of this memory cell. Although not clearly shown, part of the oxide semiconductor layer 114b, which faces the second layer wiring 112f corresponds to the other electrode of the capacitor.

In other words, when the surface of the second layer wiring 112f is formed using a material whose work function is smaller than the electron affinity of the oxide semiconductor, such as titanium or titanium nitride, electrons are induced in the oxide semiconductor layer 114b facing the second layer wiring 112f and the oxide semiconductor layer 114b exhibits n-type conductivity; thus, the oxide semiconductor layer 114b can be used as the electrode of the capacitor.

The capacitor of the memory cell is a planar capacitor. Although the capacitance of the capacitor is thus small, it does not matter when the capacitance is 20% or more of the sum of the parasitic capacitance of the sub bit line and the capacitance of the amplifier circuit as described in Embodiment 1; thus, operation is not disturbed even when the capacitance of the capacitor is 0.1 fF or less, for example. In addition, because of the planar structure, it is easy to stack the memory cells, which is preferable for an increase in an integration degree.

Further, the second layer wiring 112e serves as a drain of the transistor of the memory cell. Note that since the second layer wiring 112e also serves as a drain of a transistor (which uses a left half of the oxide semiconductor layer 114b) of an adjacent memory cell, the integration degree can be increased.

Note that for an increase in the integration degree, the structure is effective in which the counter electrode (the second layer wiring 112f) of the capacitor and the word line 116d are provided with the oxide semiconductor layer 114b interposed therebetween as illustrated in FIG. 7A. In addition, with this structure, parasitic capacitance between the word line 116d and the second layer wiring 112f can be reduced with the integration degree maintained.

Figure 7B:
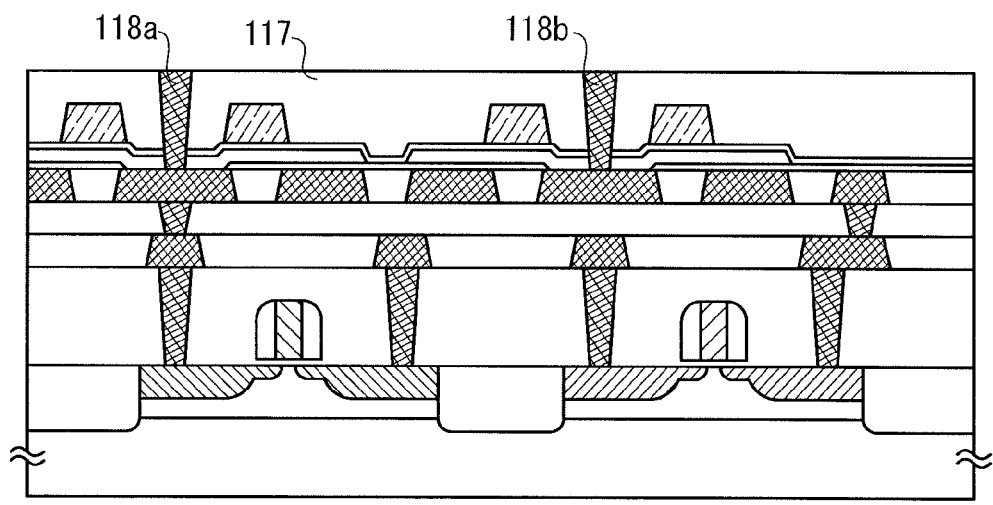
Figure 8:
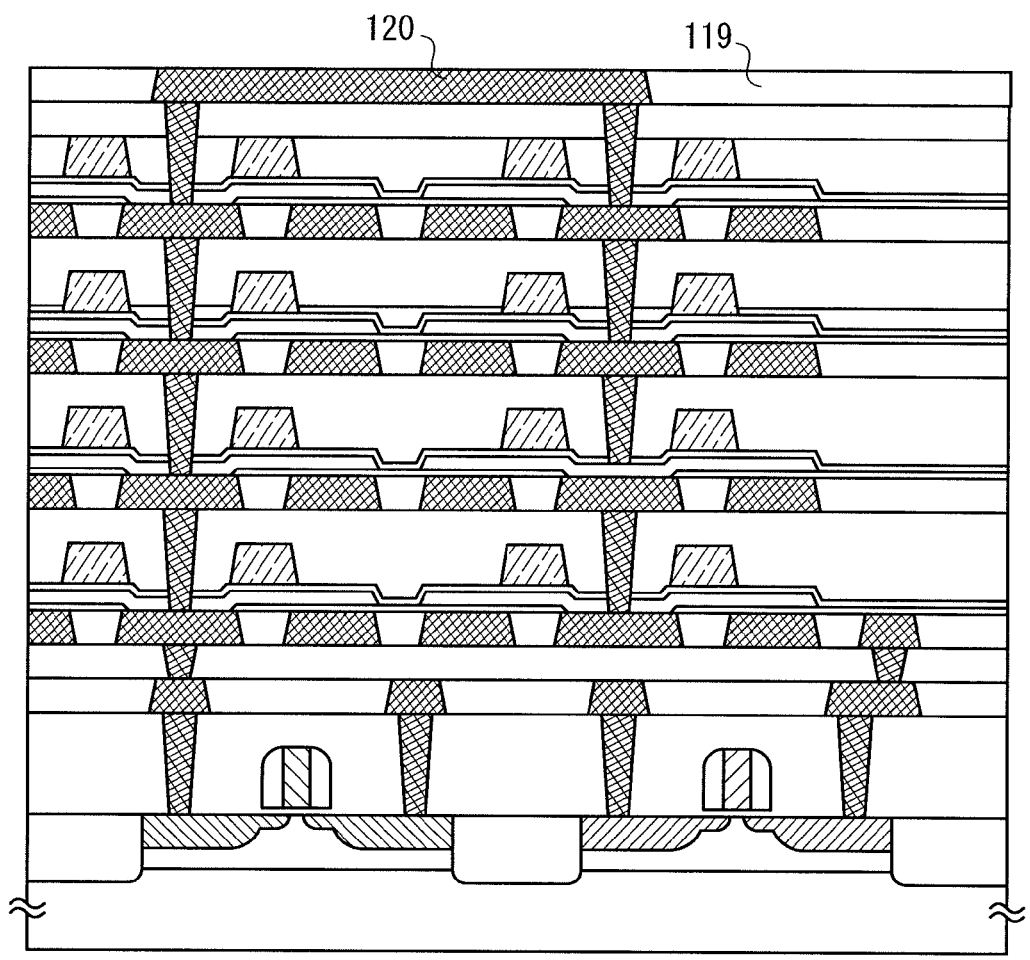
FIG. 8 illustrates the example of the process for manufacturing the semiconductor memory device of the present invention.
Figure 9:
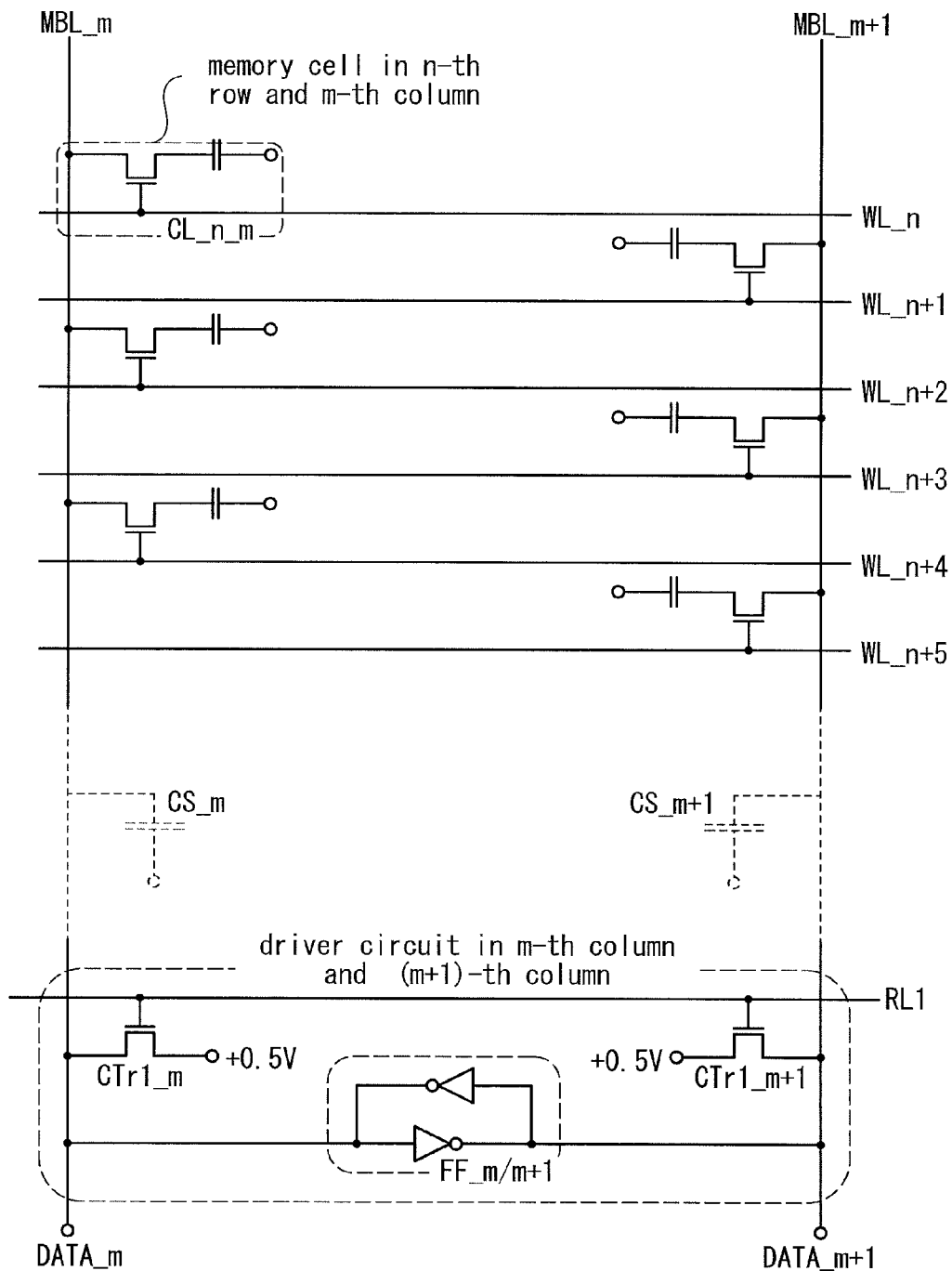
FIG. 9 illustrates an example of a conventional semiconductor memory device (DRAM)

Then, a third interlayer insulator 117 and third contact plugs 118a and 118b are formed (see FIG. 7B). Further, a second memory cell layer, a third memory cell layer, and a fourth memory cell layer are similarly formed thereover. A sixth embedded insulator 119 and a sixth layer wiring 120 are formed, whereby formation of memory cells is completed (see FIG. 8). Here, the wirings and contact plugs which are connected to the sixth layer wiring 120 serve as sub bit lines and connect drains of transistors of the memory cells.

Although an oxide semiconductor is employed as the semiconductor used in the transistor of the memory cell in the above example, another kind of semiconductor may be alternatively used. For example, a polycrystalline or single crystal silicon film which is crystallized by irradiation with laser light may be used.

Embodiment 3

In this embodiment, a semiconductor memory device illustrated in FIG. 10 and an operation example thereof are described. FIG. 10 shows the cell in the n-th row and the m-th column, the cell in the n-th row and the (m+1)-th column, and part of a driver circuit in the m-th column and the (m+1)-th column which are included in the semiconductor memory device.

The cell of the semiconductor memory device of this embodiment includes the first selection transistor STr1, the second selection transistor STr2, a plurality of memory cells, an amplifier circuit, and the sub bit line SBL. Although the n-channel transistor NMOS is included as the amplifier circuit in the semiconductor memory device illustrated in FIG. 10, a p-channel transistor may be alternatively used.

The drain of the first selection transistor STr1_n_m and the drain of the first selection transistor STr1_n_m+1 are respectively connected to the bit line MBL_m and the bit line MBL_m+1; the source of the first selection transistor STr1_n_m and the source of the first election transistor STr1_n_m+1 are respectively connected to the sub bit line SBL_n_m and the sub bit line SBL_n_m+1; and both the gate of the first selection transistor STr1_n_m and the gate of the first selection transistor STr1_n_m+1 are connected to the first selection line SL1_n.

The drain of the second selection transistor STr2_n_m and the drain of the second selection transistor STr2_n_m+1 are respectively connected to the source of the n-channel transistor NMOS_n_m and a source of the n-channel transistor NMOS_n_m+1; both the gate of the second selection transistor STr2_n_m and the gate of the second selection transistor STr2_n_m+1 are connected to the second selection line SL2_n; and both the source of the second selection transistor STr2_n_m and the source of the second selection transistor STr2_n_m+1 are held at a fixed potential (here, 0 V).

The drain of the n-channel transistor NMOS_n_m and a drain of the n-channel transistor NMOS_n_m+1 are respectively connected to the bit line MBL_m and the bit line MBL_m+1; the gate of the n-channel transistor NMOS_n_m and a gate of the n-channel transistor NMOS_n_m+1 are respectively connected to the sub bit line SBL_n_m+1 and the sub bit line SBL_n_m.

Further, the memory cell includes a transistor and a capacitor; one electrode of the capacitor and a source of the transistor are connected, and a drain of the transistor is connected to the sub bit line SBL. The other electrode of the capacitor is held at a fixed potential (here, 0 V).

Further, the gate of the transistor of the memory cell is connected to the word line WL in the following manner the word line WL_n_1 is connected to the gate of the transistor of the memory cell in the cell in the n-th row and the m-th column but is not connected to the gate of the transistor of the memory cell in the cell in the n-th row and the (m+1)-th column; and the word line WL_n_2 is connected to the gate of the transistor of the memory cell in the cell in the n-th row and the (m+1)-th column but is not connected to the gate of the transistor of the memory cell in the cell in the n-th row and the m-th column.

That is, when the potential of one word line WL is H, as for a cell in the m-th column and an adjacent cell in the (m+1)-th column through which the word line WL goes, one of the cells has one memory cell in which the transistor is on, and the other cell does not have any memory cell in which the transistor is on.

The driver circuit includes the first column transistors CTr1_m and CTr1_m+1, second column transistors CTr2_m and CTr2_m+1, third column transistors CTr3_m and CTr3_m+1, and the flip-flop circuit FF_m/m+1.

Both a gate of the first column transistor CTr1_m and a gate of the first column transistor CTr1_m+1 are connected to the first column driver line RL1; the drain of the first column transistor CTr1_m and the drain of the first column transistor CTr1_m+1 are respectively connected to the bit line MBL_m and the bit line MBL_m+1; and both the source of the first column transistor CTr1_m and the source of the first column transistor CTr1_m+1 are held at a fixed potential (here, +0.5 V).

Both a gate of the second column transistor CTr2_m and a gate of the second column transistor CTr2_m+1 are connected to a second column driver line RL2; a drain of the second column transistor CTr2_m and a drain of the second column transistor CTr2_m+1 are respectively connected to the bit line MBL_m and the bit line MBL_m+1; and a source of the second column transistor CTr2_m and a source of the second column transistor CTr2_m+1 are respectively connected to first input of the flip-flop circuit FF_m/m+1 and second input of the flip-flop circuit FF_m/m+1.

Both a gate of the third column transistor CTr3_m and a gate of the third column transistor CTr3_m+1 are connected to a third column driver line RL3; a source of the third column transistor CTr3_m and a source of the third column transistor CTr3_m+1 are respectively connected to the source of the second column transistor CTr2_m and the source of the second column transistor CTr2_m+1; and a drain of the third column transistor CTr3_m and a drain of the third column transistor CTr3_m+1 are respectively connected to the data input/output terminal DATA_m in the m-th column and the data input/output terminal DATA_m+1 in the (m+1)-th column.

A reading method of a semiconductor memory device having such a structure is described with reference to FIG. 11. Here, it is assumed that the capacitor of the memory cell which includes the transistor connected to the word line WL_n_1 in the cell in the n-th row and the m-th column is charged to +1 V. Further, the capacitance of the capacitor of each of the memory cells is one fourth of the sum of the parasitic capacitance of the sub bit line SBL and the capacitance (including the gate capacitance and parasitic capacitance) of the n-channel transistor NMOS.

Further, the threshold voltage of the n-channel transistor NMOS is +0.5 V, and when the potential of the gate is +0.5 V, current which is ten times as high as current which flows when the potential of the gate is +0.4 V flows between the source and the drain (i.e., the resistance between the source and the drain is one tenth); and when the potential of the gate is +0.6 V, current which is ten times as high as current which flows when the potential of the gate is +0.5 V flows between the source and the drain.

First, as shown in a period T1 in FIG. 11, the potentials of the first column driver line RL1 and the first selection line SL1_n are set to H, so that the first column transistors CTr1_m and CTr1_m+1 and the first selection transistors STr1_n_m and STr1_n_m+1 are turned on. Further, both the high power supply potential and the low power supply potential of the flip-flop circuit FF_m/m+1 are set to, at first, +0.5 V.

As a result, the potentials of the bit lines MBL_m and MBL_m+1 and the sub bit lines SBL_n_m and SBL_n_m+1 are +0.5 V. Then, the potentials of the first column driver line RL1 and the first selection line SL1_n are set to L, so that the first column transistors CTr1_m and CTr1_m+1 and the first selection transistors STr1_n_m and STr1_n_m+1 are turned off.

After that, as shown in a period T2 in FIG. 11, the potential of the word line WL_n_1 is set to H. Since the cell in the n-th row and the m-th column includes the memory cell which includes the transistor connected to the word line WL_n_1, this transistor is turned on, so that electric charge accumulated in the capacitor is released and the potential of the sub bit line SBL_n_m changes.

The potential of the capacitor of that memory cell is +1 V and the capacitance of the capacitor is one fourth of the sum of the parasitic capacitance of the sub bit line SBL_n_m and the capacitance (including the gate capacitance and parasitic capacitance) of the n-channel transistor NMOS_n_m+1; thus, the potential of the sub bit line SBL_n_m becomes +0.6 V. Note that, when the potential of the capacitor is 0 V, the potential of the sub bit line SBL_n_m becomes +0.4 V.

On the other hand, the cell in the n-th row and the (m+1)-th column does not have any memory cell which includes a transistor connected to the word line WL_n_1; thus, the potential of the sub bit line SBL_n_m+1 does not change and remains at +0.5 V.

Then, as shown in a period T3 in FIG. 11, the potential of the second selection line SL2_n is set to H, so that the second selection transistors STr2_n_m and STr2_n_m+1 are turned on. As a result, the potentials of the bit lines MBL_m and MBL_m+1 change from the initial potential of +0.5 V.

Since the resistance of the n-channel transistor NMOS_n_m+1 in the (m+1)-th column is lower than the resistance of the n-channel transistor NMOS_n_m in the m-th column, the potential of the bit line MBL_m+1 decreases more distinctively than the potential of the bit line MBL_m. In other words, the potential of the bit line MBL_m becomes higher than the potential of the bit line MBL_m+1.

After that, as shown in a period T4 in FIG. 11, the potential of the second column driver line RL2 is set to H, so that the second column transistors CTr2_m and CTr2_m+1 are turned on. Further, the high power supply potential of the flip-flop circuit FF_m/m+1 is set to +1 V and the low power supply potential is set to 0 V. As a result, the flip-flop circuit FF_m/m+1 operates, so that the potential of the bit line MBL_m having higher potential becomes +1 V and the potential of the bit line MBL_m+1 having lower potential becomes 0 V.

Then, as shown in a period T5 in FIG. 11, the potential of the third column driver line RL3 is set to H, so that the third column transistors CTr3_m and CTr3_m+1 are turned on. As a result, the potentials of the bit lines are output to the data input/output terminal DATA_m in the m-th column and the data input/output terminal DATA_m+1 in the (m+1)-th column. In that case, the potential of the data input/output terminal DATA_m may be read.

Reading is thus completed. However, since the electric charge accumulated in the memory cell is already released, the data is broken. Thus, as shown in a period T6 in FIG. 11, the potential of the first selection line SL1_n is set to H, so that the first selection transistors STr1_n_m and STr1_n_m+1 are turned on.

Accordingly, the potential of the sub bit line SBL_n_m becomes equal to that of the bit line MBL_m, i.e., +1 V. Since the transistor connected to the word line WL_n_1 is on, the capacitor connected to the transistor is also charged to +1 V. In other words, the potential of the capacitor, which is +1 V at first, decreases to +0.6 V at the time of reading but returns to the initial potential of +1 V by the operation in the period T6 in FIG. 11.

The potential of the capacitor of the memory cell is set to +1 V in the above example; similarly, also in the case where the potential of the capacitor is set to 0 V at first, the potential of the capacitor which increases to +0.4 V at the time of reading can return to the initial potential of 0 V by a subsequent operation.

After the above-described operation finishes, the potentials of the first selection line SL1_n, the second column driver line RL2, the word line WL_n_1, the second selection line SL2_n and the third column driver line RL3 are set to L, so that the transistors which are connected to those lines are turned off.

The above description is made on reading; at the time of writing, a potential to be written may be supplied to the data input/output terminal DATA in the period T5 which is used for reading. For example, when data is to be written into the (m+2)-th column in the above process, the potential of the data input/output terminal DATA_m+2 may be set to a potential (here, +1 V) in accordance with the data in the periods T4 to T6, and the potential of the adjacent data input/output terminal DATA_m+3 in the (m+3)-th column may be set to a potential (that is, 0 V) in accordance with the opposite data (see FIG. 11).

Embodiment 4

In this embodiment, examples of a layout and a process for manufacturing a semiconductor memory device similar to the semiconductor memory device illustrated in FIG. 10 are described with reference to FIGS. 12A to 12E and FIGS. 13A to 13C. In FIGS. 12A to 12E, examples of a layer-by-layer layout of main wirings and the like in the cell in the n-th row and the m-th column and the cell in the n-th row and the (m+1)-th column are illustrated. The semiconductor memory device of this embodiment is formed by stacking those layers.

Note that only the cell in the n-th row and the m-th column is described with reference numerals below. The description can also be applied to the cell in the n-th row and the (m+1)-th column. Further, FIGS. 13A to 13C are cross-sectional views illustrating a process for manufacturing the semiconductor memory device and each correspond to a cross section taken along a line A-B in FIGS. 12A to 12E.

Figure 12A:
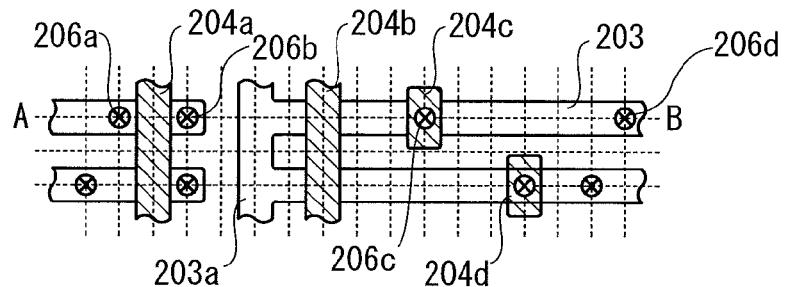
FIGS. 12A to 12E illustrate an example of the semiconductor memory device of the present invention.
Figure 13A:
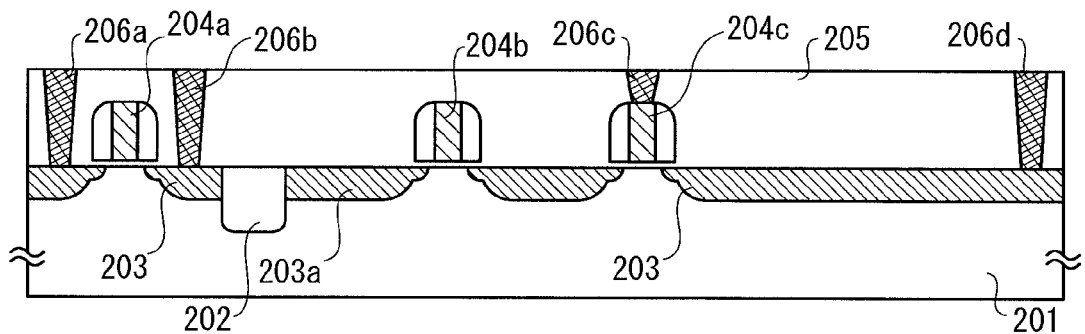
FIGS. 13A to 13C illustrate an example of a process for manufacturing the semiconductor memory device of the present invention.
Figure 13B:
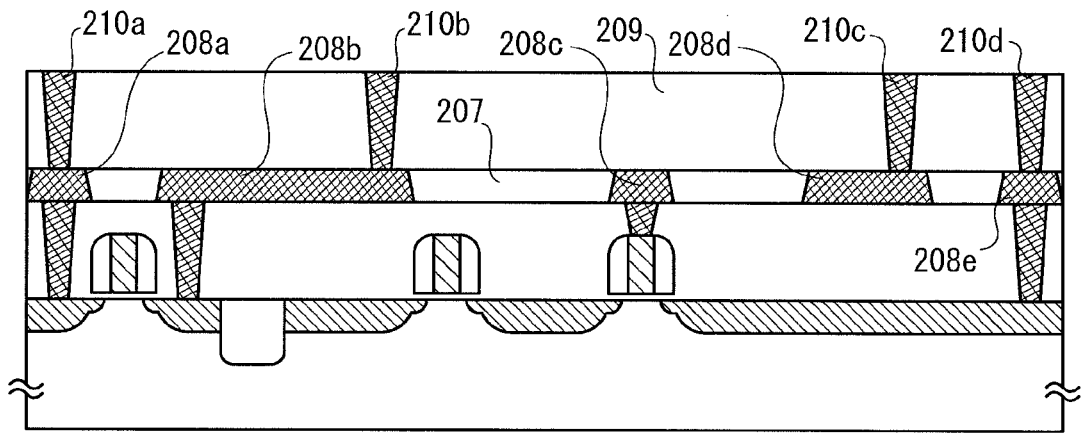
Figure 13C:
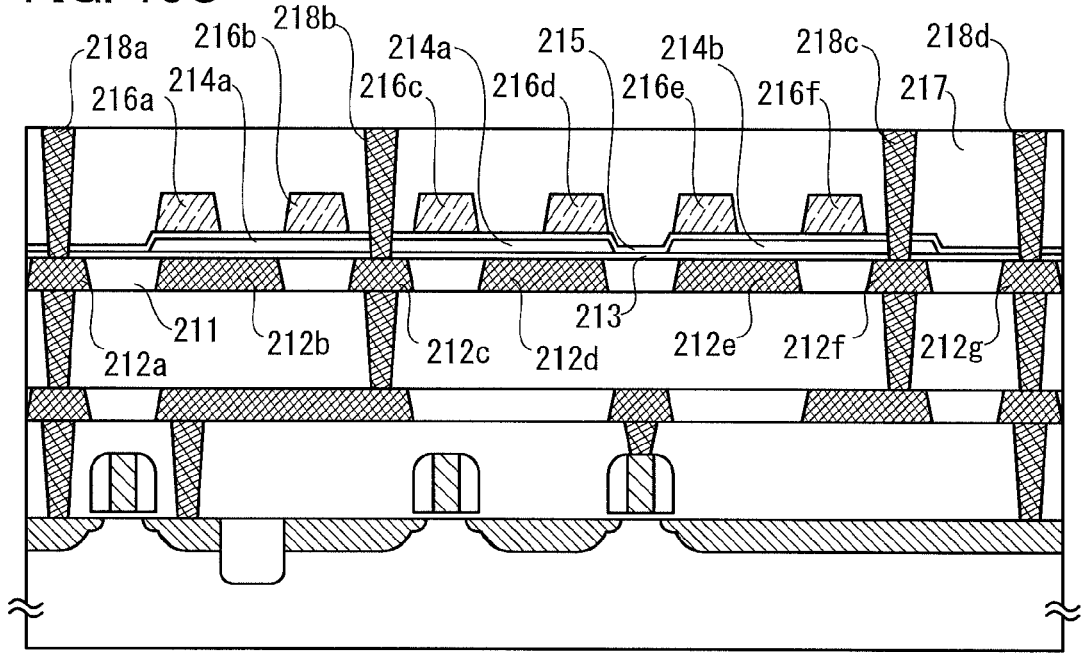

In FIG. 12A, positions of an n-type impurity region 203, first layer wirings 204a to 204c, and first contact plugs 206a to 206d, which are provided over a single crystal semiconductor substrate are illustrated. The first contact plug 206d corresponds to the first contact plug 206a in the cell in a next row. The first layer wiring 204a functions as the first selection line SL1_n, and the first layer wiring 204b functions as the second selection line SL2_n.

Further, the first layer wiring 204c functions as the gate of the n-channel transistor NMOS_n_m. Note that the first layer wiring 204c is positioned to be shifted from a corresponding first layer wiring 204d in the n-th row and the (m+1)-th column in a horizontal direction as illustrated in FIG. 12A, whereby a distance between the bit lines can be smaller and thus the area occupied by the cell can be reduced.

Figure 12B:
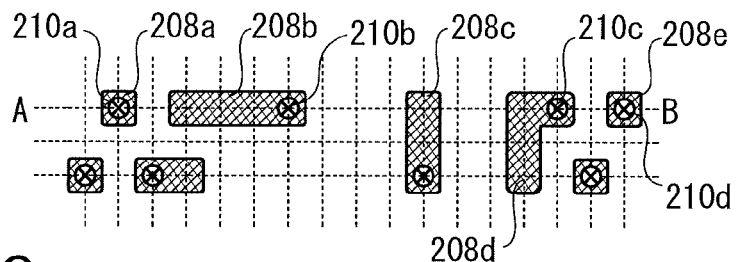

In FIG. 12B, positions of second layer wirings 208a to 208e and second contact plugs 210a to 210d are illustrated. The second layer wiring 208c is used to connect the sub bit line SBL_n_m+1 and the gate of the n-channel transistor NMOS_n_m. Further, the second layer wiring 208d is used to connect the sub bit line SBL_n_m and the gate of the n-channel transistor NMOS_n_m+1.

Figure 12C:
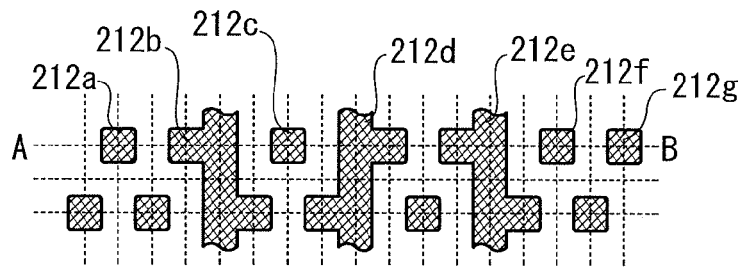
Figure 12D:
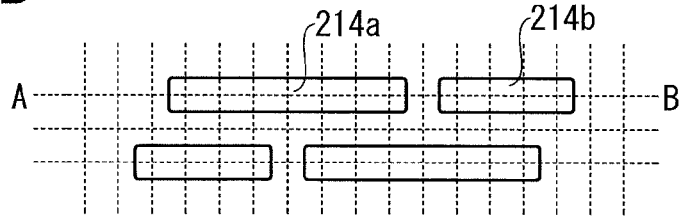
Figure 12E:
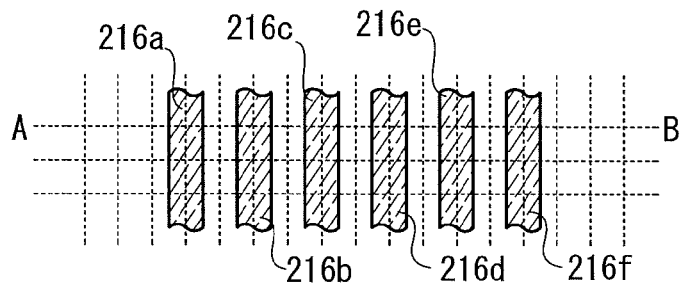

In FIG. 12C, positions of third layer wirings 212a to 212g are illustrated. Each of the third layer wirings 212b, 212d, and 212e serves as an electrode of a capacitor of a memory cell. In FIG. 12D, positions of oxide semiconductor layers 214a and 214b are illustrated. In FIG. 12E, positions of word lines 216a to 216f are illustrated.

The manufacturing process is described below with reference to FIGS. 13A to 13C; Embodiment 2 may be referred to for a material, a condition, and the like to be employed. As illustrated in FIG. 13A, an element separation insulator 202, the n-type impurity region 203, the first layer wirings 204a to 204c, a first interlayer insulator 205, the first contact plugs 206a to 206d are formed over a single crystal semiconductor substrate 201.

Note that, as also illustrated in FIG. 12A, a part 203a of the n-type impurity region 203 illustrated in FIG. 13A, which is on the left side of the first layer wiring 204b extends in the same direction as the first selection line (i.e., the first layer wiring 204a) or the second selection line (i.e., the first layer wiring 204b) and can be used as a wiring. In other words, the part 203a can be used to keep the potential of the source of the second selection transistor at a fixed value.

Then, as illustrated in FIG. 13B, a first embedded insulator 207, the second layer wirings 208a to 208e, a second interlayer insulator 209, and the second contact plugs 210a to 210d are formed.

Further, as illustrated in FIG. 13C, a second embedded insulator 211, the third layer wirings 212a to 212g, an insulator 213 for a capacitor, the oxide semiconductor layers 214a and 214b, a gate insulator 215, the word lines 216a to 216f, a third interlayer insulator 217, third contact plugs 218a to 218d are formed.

From the above steps, one memory cell layer can be formed. An integration degree can be increased by stacking more memory cell layers as in Embodiment 2. Note that it is necessary that the first contact plug 206b, the second layer wirings 208b and 208d, the second contact plugs 210b and 210c, the third layer wirings 212c and 212f, and the third contact plugs 218b and 218c be electrically connected so as to form the sub bit line SBL_n_m. Further, the first contact plug 206c and the second layer wiring 208c are part of the sub bit line SBL_n_m+1.

Moreover, the first contact plugs 206a and 206d, the second layer wirings 208a and 208e, the second contact plugs 210a and 210d, the third layer wirings 212a and 212g, and the third contact plugs 218a and 218d form the bit line MBL_m.

In FIG. 13C, three memory cells are illustrated. The three memory cells are memory cells which include transistors whose gates are the word lines 216b, 216c, and 216f. Here, the memory cell including the transistor whose gate is the word line 216c is described.

The transistor of this memory cell is formed using a right half of the oxide semiconductor layer 214a. The third layer wiring 212d is a counter electrode of a capacitor of this memory cell. The memory cell is provided with a capacitor whose capacitance is about twice as large as the gate capacitance.

Further, the third layer wiring 212c serves as a drain of the transistor of the memory cell. Note that since the third layer wiring 212c also serves as a drain of a transistor (which uses a left half of the oxide semiconductor layer 214a) of an adjacent memory cell, the integration degree can be increased.

Embodiment 5

Figure 14:
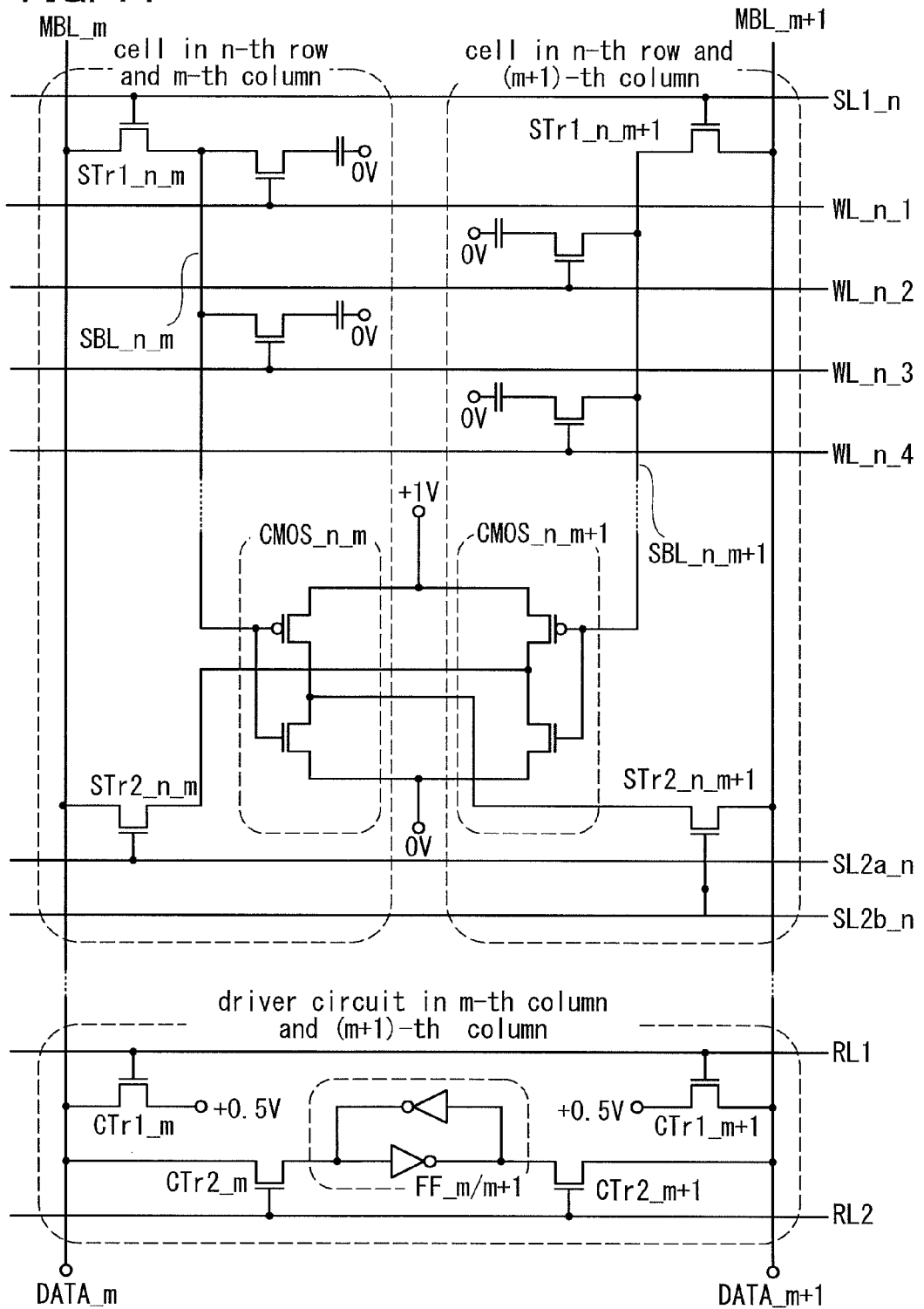
FIG. 14 illustrates an example of a semiconductor memory device of the present invention.

In this embodiment, a semiconductor memory device illustrated in FIG. 14 is described. FIG. 14 shows the cell in the n-th row and the m-th column and the cell in the n-th row and the (m+1)-th column, and part of a driver circuit in the m-th column and the (m+1)-th column which are included in the semiconductor memory device.

Similarly to the cell illustrated in FIG. 2A, the cell of the semiconductor memory device of this embodiment includes the first selection transistor STr1, the second selection transistor STr2, a plurality of memory cells, the complementary inverter CMOS, and the sub bit line SBL. The memory cell includes a transistor and a capacitor; one electrode of the capacitor and a source of the transistor are connected, and a drain of the transistor is connected to the sub bit line SBL. Further, the other electrode of the capacitor is held at a fixed potential (here, 0 V). In the description below, a high power supply potential of the complementary inverter CMOS is held at +1 V and a low power supply potential of the complementary inverter CMOS is held at 0 V.

Note that output of the complementary inverter CMOS in one of the cells is connected to the source of the second selection transistor STr2 in the other of the cells. In other words, the output of the complementary inverter CMOS_n_m is connected to the second selection transistor STr2_n_m+1, and the output of the complementary inverter CMOS_n_m+1 is connected to the second selection transistor STr2_n_m.

The gate of the second selection transistor STr2_n_m is connected to a second selection line SL2a_n, and the gate of the second selection transistor STr2_n_m+1 is connected to a second selection line SL2b_n. Accordingly, the second selection transistors STr2 in adjacent two cells in the same row can be independently controlled.

Further, the gate of the transistor of the memory cell is connected to the word line WL in the following manner: the word line WL_n_1 is connected to the gate of the transistor of the memory cell in the cell in the n-th row and the m-th column but is not connected to the gate of the transistor of the memory cell in the cell in the n-th row and the (m+1)-th column; and the word line WL_n_2 is connected to the gate of the transistor of the memory cell in the cell in the n-th row and the (m+1)-th column but is not connected to the gate of the transistor of the memory cell in the cell in the n-th row and the m-th column.

That is, when the potential of one word line is H, as for a cell in the m-th column and an adjacent cell in the (m+1)-th column through which the word line goes, of the cells has one memory cell in which the transistor is on, and the other cell does not have any memory cell in which the transistor is on.

The driver circuit includes the first column transistors CTr1_m and CTr1_m+1, the second column transistors CTr2_m and CTr2_m+1, and the flip-flop circuit FF_m/m+1.

Both the gate of the first column transistor CTr1_m and the gate of the first column transistor CTr1_m+1 are connected to the first column driver line RL1; the drain of the first column transistor CTr1_m and the drain of the first column transistor CTr1_m+1 are respectively connected to the bit line MBL_m and the bit line MBL_m+1; and both the source of the first column transistor CTr1_m and the source of the first column transistor CTr1_m+1 are held at a fixed potential (here, +0.5 V).

Both the gate of the second column transistor CTr2_m and the gate of the second column transistor CTr2_m+1 are connected to the second column driver line RL2; the drain of the second column transistor CTr2_m and the drain of the second column transistor CTr2_m+1 are respectively connected to the bit line MBL_m and the bit line MBL_m+1; and the source of the second column transistor CTr2_m and the source of the second column transistor CTr2_m+1 are respectively connected to the first input of the flip-flop circuit FF_m/m+1 and the second input of the flip-flop circuit FF_m/m+1.

Further, the bit line MBL_m and the bit line MBL_m+1 are respectively connected to the data input/output terminal DATA_m in the m-th column and the data input/output terminal DATA_m+1 in the (m+1)-th column.

A reading method of a semiconductor memory device having such a structure is described. Here, it is assumed that the capacitor of the memory cell which includes the transistor connected to the word line WL_n_1 in the cell in the n-th row and the m-th column is charged to +1 V.

Further, the capacitance of the capacitor of each of the memory cells is one fourth of the sum of the parasitic capacitance of the sub bit line SBL and the capacitance (including the gate capacitance and parasitic capacitance) of the complementary inverter CMOS. Furthermore, the complementary inverter CMOS outputs 0 V in the case where input is +0.6 V or higher, and outputs +1 V in the case where input is +0.4 V or lower.

<First Step (Precharge)>

At first, both the high power supply potential and the low power supply potential of the flip-flop circuit FF_m/m+1 are set to +0.5 V. First, the potentials of the first column driver line RL1 and the first selection line SL1_n are set to H, so that the first column transistors CTr1_m and CTr1_m+1 and the first selection transistors STr1_n_m and STr1_n_m+1 are turned on.

As a result, the potentials of the bit lines MBL_m and MBL_m+1 and the sub bit lines SBL_n_m and SBL_n_m+1 are +0.5 V. Then, the potentials of the first column driver line RL1 and the first selection line SL1_n are set to L, so that the first column transistors CTr1_m and CTr1_m+1 and the first selection transistors STr1_n_m and STr1_n_m+1 are turned off.

<Second Step (Release Electric Charge)>

Then, the potential of the word line WL_n_1 is set to H. Since the cell in the n-th row and the m-th column includes the memory cell which includes the transistor connected to the word line WL_n_1, this transistor is turned on, so that electric charge accumulated in the capacitor is released and the potential of the sub bit line SBL_n_m changes.

Time for the potential of the sub bit line SBL_n_m to be stable is proportional to the product of on resistance of a transistor connected to the word line WL_n_1 and the capacitance of the sub bit line SBL_n_m. The capacitance of the sub bit line can be 1 fF or less, which is smaller than or equal to one several hundredth of the capacitance of a bit line of a conventional DRAM. Thus, even when the on resistance of the transistor is several hundred times as high as that of a transistor using silicon, which is generally used in a conventional DRAM, the time for the potential of the sub bit line SBL_n_m to be stable is almost the same as that in the case of a conventional DRAM. The potential of the sub bit line SBL_n_m can be stable in a shorter time by making the capacitance of the sub bit line SBL_n_m smaller.

For example, even with a transistor using an oxide semiconductor, whose on resistance is several ten times to several hundred times as high as that of a transistor using silicon (that is, the field-effect mobility of the transistor using the oxide semiconductor is one several tenth to one several hundredth of the transistor using the silicon), reading can be performed at almost the same speed as a conventional DRAM, or at higher speed than a conventional DRAM.

The potential of the capacitor of the memory cell is +1 V and the capacitance of the capacitor is one fourth of the sum of the parasitic capacitance of the sub bit line SBL_n_m and the capacitance (including the gate capacitance and parasitic capacitance) of the n-channel transistor NMOS_n_m+1; thus, the potential of the sub bit line SBL_n_m becomes +0.6 V. Note that, when the potential of the capacitor is 0 V, the potential of the sub bit line SBL_n_m becomes +0.4 V.

On the other hand, the cell in the n-th row and the (m+1)-th column does not have any memory cell which includes a transistor connected to the word line WL_n_1; thus, the potential of the sub bit line SBL_n_m+1 does not change and remains at +0.5 V.

<Third Step (Charge Bit Line)>

Subsequently, the potential of the second selection line SL2b_n is set to H, so that the second selection transistor STr2_n_m+1 is turned on. At this time, the potential of the second selection line SL2a_n is kept at L. As a result, only the potential of the bit line MBL_m+1 changes from the initial potential of +0.5 V. The potential of the bit line MBL_m remains at +0.5 V. Note that at the time of reading data in the cell in the (m+1)-th column, the potential of the second selection line SL2b_n may be kept at L and the potential of the second selection line SL2a_n may be set to H.

Since the potential of the sub bit line SBL_n_m is +0.6 V, the output of the complementary inverter CMOS_n_m is 0 V, and the potential of the bit line MBL_m+1 becomes close to this value. In other words, the potential (+0.5 V) of the bit line MBL_m becomes higher than the potential of the bit line MBL_m+1.

Note that performing the second and third steps at the same time does not bring about an adverse effect and is preferable for an increase in reading speed. That is, it is preferable that the potential of the word line WL_n_1 and the potential of the second selection line SL2b_n be set to H at substantially the same time.

<Fourth Step (Amplify Potential of Bit Line>

Subsequently, the potential of the second column driver line RL2 is set to H, so that the second column transistors CTr2_m and CTr2_m+1 are turned on. Further, the high power supply potential of the flip-flop circuit FF_m/m+1 is set to +1 V and the low power supply potential of the flip-flop circuit FF_m/m+1 is set to 0 V. As a result, the flip-flop circuit FF_m/m+1 operates, so that the potential of the bit line MBL_m having higher potential becomes +1 V and the potential of the bit line MBL_m+1 having lower potential becomes 0 V. Accordingly, the potential of the bit line MBL_m is output to the data input/output terminal DATA_m in the m-th column.

Reading is thus completed. However, since the electric charge accumulated in the memory cell is already released, the data is broken. Thus, the potential of the first selection line SL1_n is set to H, so that the first selection transistors STr1_n_m and STr1_n_m+1 are turned on.

Accordingly, the potential of the sub bit line SBL_n_m becomes equal to that of the bit line MBL_m, i.e., +1 V. Since the transistor connected to the word line WL_n_1 is on, the capacitor connected to the transistor is also charged to +1 V. In other words, the potential of the capacitor, which is +1 V at first, decreases to +0.6 V at the time of reading but returns to the initial potential of +1 V by the above-described operation.

The potential of the capacitor of the memory cell is set to +1 V in the above example; similarly, also in the case where the potential of the capacitor is set to 0 V at first, the potential of the capacitor which increases to +0.4 V at the time of reading can return to the initial potential of 0 V by a subsequent operation.

After the above-described operation finishes, the potentials of the first selection line SL1_n, the second column driver line RL2, the word line WL_n_1, and the second selection line SL2b_n are set to L, so that the transistors which are connected to those lines are turned off.

The above description is made on reading; when writing needs to be performed, after the fourth step, a potential to be written may be supplied to the data input/output terminal DATA_m and a potential opposite to the potential to be written may be supplied to the data input/output terminal DATA_m+1. For example, when a potential of 0 V and a potential of +1 V are supplied to the data input/output terminal DATA_m and the data input/output terminal DATA_m+1, respectively, the capacitor of the memory cell CL_n_m is charged to 0 V.

Note that a problem related to the on resistance of the transistor of the memory cell is minor also at the time of writing, which allows the use of a semiconductor material whose field-effect mobility is one several tenth to one several hundredth of a silicon semiconductor, such as an oxide semiconductor, for example. Detailed description is as follows.

In a conventional DRAM, time required for writing is proportional to the product of the capacitance of a bit line, and the sum of the resistance of the bit line and the on resistance of a transistor of a memory cell. Actually, since the resistance of the bit line is sufficiently lower than the on resistance of the transistor, the time required for writing can be calculated proportionally to the product of the capacitance of the bit line and the on resistance of the transistor of the memory cell.

On the other hand, in this embodiment, writing is performed through two separate steps below. That is, writing is performed through (1) a step of charging a bit line to a potential to be written and (2) a step of charging a sub bit line and a capacitor. Since time required for the step (1) of the two steps is proportional to the product of the resistance and capacitance of the bit line, time that is several percent to several tens percent of that in a conventional DRAM is sufficient in this embodiment.

On the other hand, time required for the step (2) is proportional to the product of the sum of the capacitance of the sub bit line and the capacitance of the capacitor, and the sum of the on resistance of the first selection transistor and the on resistance of the transistor of the memory cell. In comparison between the on resistance of the first selection transistor and that of the transistor of the memory cell, the on resistance of the first selection transistor can be ignored in the case where an oxide semiconductor whose mobility is low is used for the transistor of the memory cell; thus, the time required for the step (2) is proportional to the product of the sum of the capacitance of the sub bit line and that of capacitor, and the on resistance of the transistor of the memory cell.

Between the above, the on resistance of the transistor of the memory cell is several ten times to several hundred times as high as that of a transistor using silicon. However, by making the sum of the capacitance of the sub bit line and that of the capacitor smaller than or equal to one several hundredth of the capacitance of a bit line of a conventional DRAM, the product of the sum of the capacitance of the sub bit line and that of the capacitor and the on resistance of the transistor of the memory cell can be smaller than the product of the capacitance of the bit line of the conventional DRAM and the on resistance of the transistor of the memory cell.

In other words, time (the total time of the above steps (1) and (2)) required for writing in the semiconductor memory device described in this embodiment can be almost equal to or shorter than that required for writing in a conventional DRAM. Especially when an oxide semiconductor whose band gap is large is used as a semiconductor of the transistor of the memory cell, refreshing can be substantially unnecessary, which leads a reduction in power consumption.

Further, in this embodiment, a positive feedback circuit such as a flip-flop circuit is not used at the time of amplifying the potential of a sub bit line in reading. Thus, possibility of a malfunction at the time of reading can be reduced. An advantage of such a structure is described below with a specific example given.

For example, it is assumed that the potential of a sub bit line changes from +0.5 V to +0.4 V only for 1 nsec due to noise from the outside at an initial stage of reading (just before release of electric charge of a capacitor). Accordingly, in the case where a flip-flop circuit is connected to the sub bit line, the potential of the sub bit line is immediately fixed to 0 V, and a potential of 0 V is output to a bit line instead of a potential of +1 V which is needed to be output.

On the other hand, since a positive feedback circuit such as a flip-flop circuit is not connected to the sub bit line in this embodiment, such a malfunction is unlikely to occur. On the assumption that noise is generated in the third step, the complementary inverter outputs a signal in accordance with the noise; for example, when on current of the transistor of the complementary inverter is 10 μA, the amount of change in electric charge in the bit line is less than or equal to one several tenth of the total amount of electric charge in the bit line.

That is, the potential of the bit line MBL_m changes by 0.1 V at most for 1 nsec at the initial stage. Moreover, when an adverse effect of the noise is cancelled after that, change in the potential of the bit line MBL_m is immediately cancelled. Thus, the adverse effect of the noise is substantially cancelled at the time when the flip-flop circuit FF_m/m+1 operates.

Further, even when such noise is generated in the semiconductor memory device of this embodiment during the fourth step (the step of amplifying the potential of the bit line), no adverse effect occurs. At that stage, the potential of the bit line MBL_m is already +0.5 V, and the potential of the bit line MBL_m+1 is 0 V. If the potential of the complementary inverter CMOS_n_m becomes 0 V due to noise for only 1 nsec, the potential of the bit line MBL_m+1 slightly increases but does not become +0.1 V or higher. Regardless of whether the adverse effect of the noise exists, the potential of the bit line MBL_m is higher than the potential of the bit line MBL_m+1, and thus the flip-flop circuit FF_m/m+1 can accurately operate.

Embodiment 6

In this embodiment, examples of a layout and a cross-sectional view of a semiconductor memory device similar to the semiconductor memory device illustrated in FIG. 14 are described with reference to FIGS. 15A to 15C, FIGS. 16A to 16C, and FIGS. 17A and 17B. In FIGS. 15A to 15C and FIGS. 16A to 16C, examples of a layer-by-layer layout of main wirings and the like in the cell in the n-th row and the m-th column and a cell adjacent to the cell are illustrated. The semiconductor memory device of this embodiment is formed by stacking those layers. Note that the other embodiments can be referred to for details of the semiconductor memory device described in this embodiment.

Note that although the cell in the n-th row and the m-th column is described below with reference numerals, the description can also be applied to other cells. Further, FIGS. 17A and 17B are cross-sectional views of the semiconductor memory device and correspond to cross sections taken along lines A-B in FIGS. 15A to 15C or FIGS. 16A to 16C. Note that part of a cross section taken along the line A-B is omitted in each of FIGS. 17A and 17B. Note also that the line A-B denotes a position of the cell in the n-th row and the m-th column.

Figure 15A:
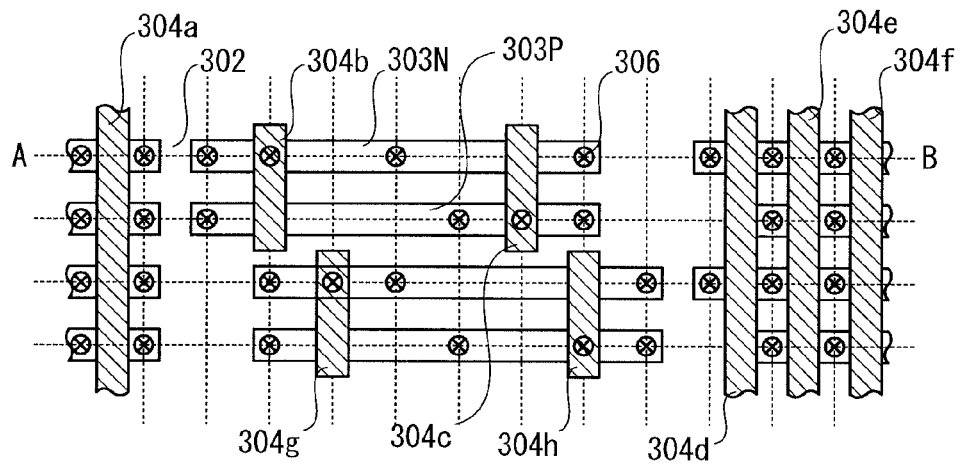
FIGS. 15A to 15C illustrate an example of the semiconductor memory device of the present invention.

FIG. 15A shows positions of an element separation insulator 302, an n-type impurity region 303N, a p-type impurity region 303P, first layer wirings 304a to 304h, and a first contact plug 306 which are provided over a single crystal semiconductor substrate. The first layer wiring 304a corresponds to the first selection line SL1_n, the first layer wiring 304d corresponds to the second selection line SL2a_n, and the first layer wiring 304e corresponds to the second selection line SL2b_n. Further, the first layer wiring 304f corresponds to the first selection line SL1_n+1 in a cell in a next row.

Further, the first layer wiring 304b corresponds to a gate of the complementary inverter CMOS_n_m, and the first layer wiring 304c corresponds to a gate of the complementary inverter CMOS_n_m+1. The first layer wirings 304g and 304h are also gates of the complementary inverters CMOS in other columns. Note that as illustrated in FIG. 15A, the first layer wiring 304c and the first layer wiring 304d are positioned so as to be shifted from the first layer wirings 304g and 304h that are gates of complementary inverters in adjacent cells in a direction of the bit line (a horizontal direction in the drawing), whereby a distance between the bit lines can be smaller and thus the are occupied by the cell can be reduced.

Figure 15B:
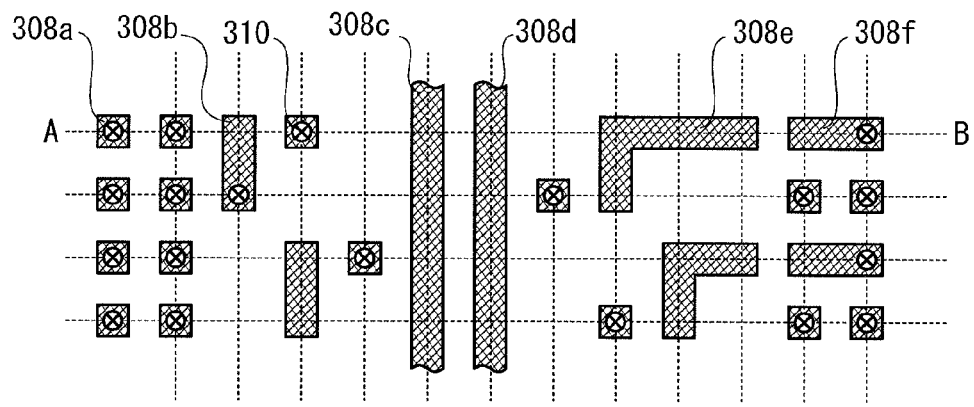

In FIG. 15B, positions of second layer wirings 308a to 308f and a second contact plug 310 are illustrated. The second layer wiring 308c is used for supply of a low potential to the complementary inverter CMOS, and the second layer wiring 308d is used for supply of a high potential to the complementary inverter CMOS. The second layer wiring 308e is a wiring which connects the output of the complementary inverter CMOS_n_m+1 and the source of the second selection transistor STr2_n_m.

Figure 15C:
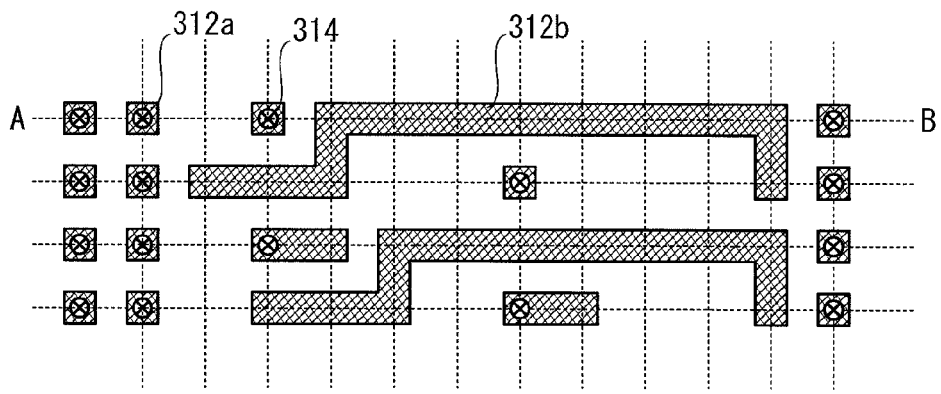

In FIG. 15C, positions of third layer wirings 312a and 312b and a third contact plug 314 are illustrated. The third layer wiring 312b is a wiring which connects the output of the complementary inverter CMOS_n_m and the source of the second selection transistor STr2_n_m+1.

Figure 16A:
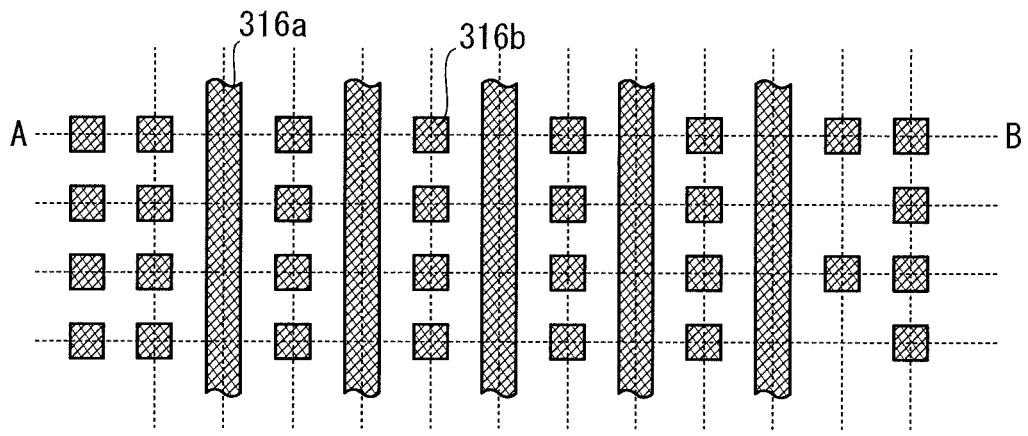
FIGS. 16A to 16C illustrate the example of the semiconductor memory device of the present invention.
Figure 16B:
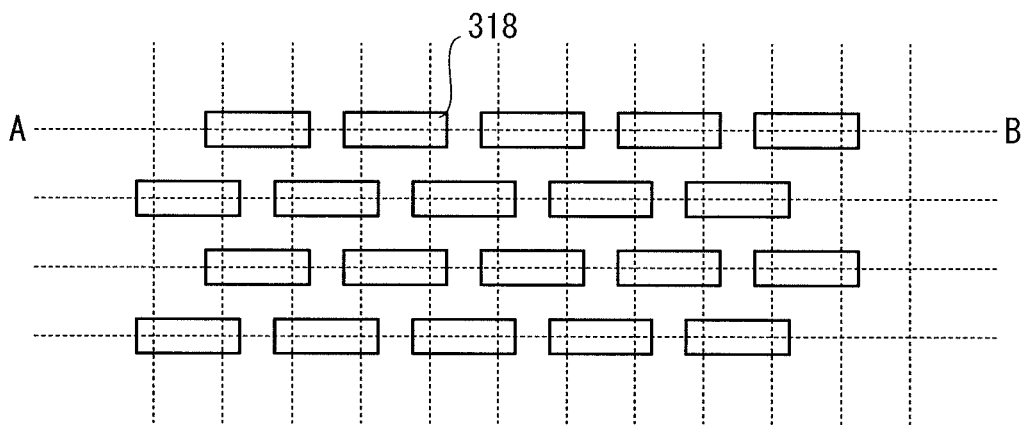
Figure 16C:
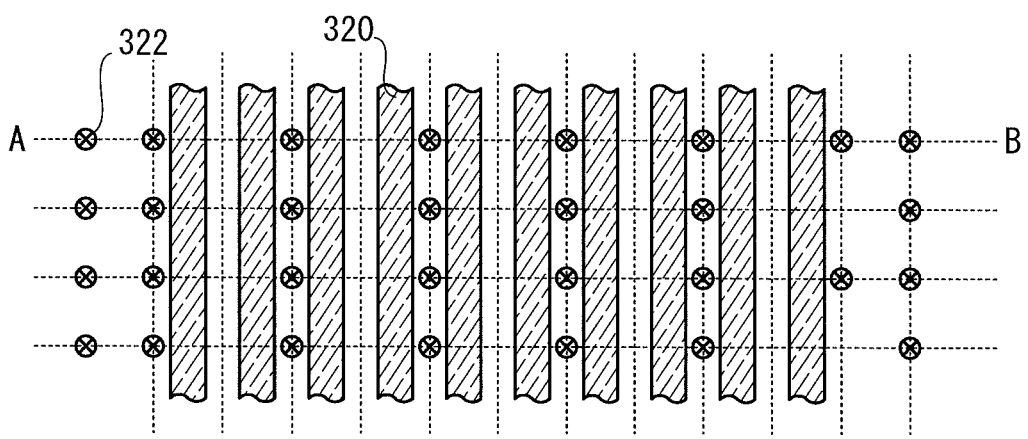
Figure 17A:
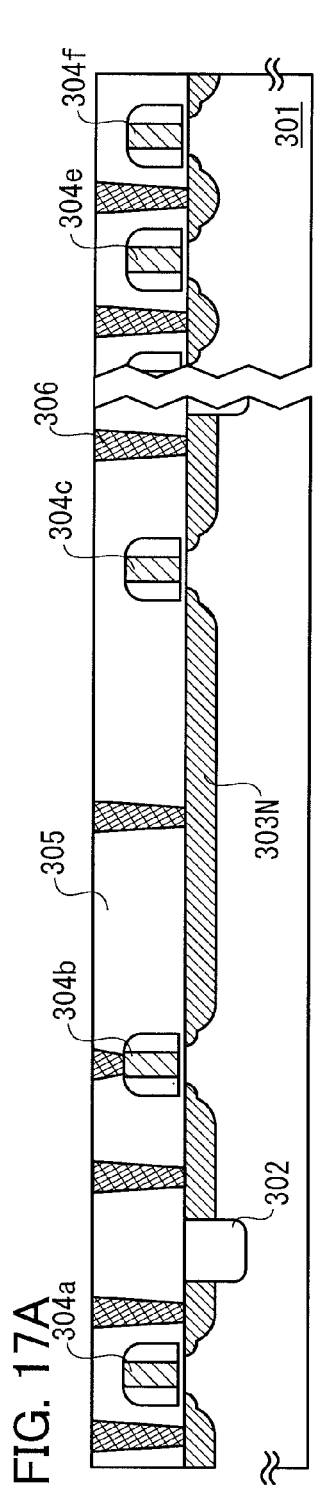
FIGS. 17A and 17B illustrate an example of the semiconductor memory device of the present invention.
Figure 17B:
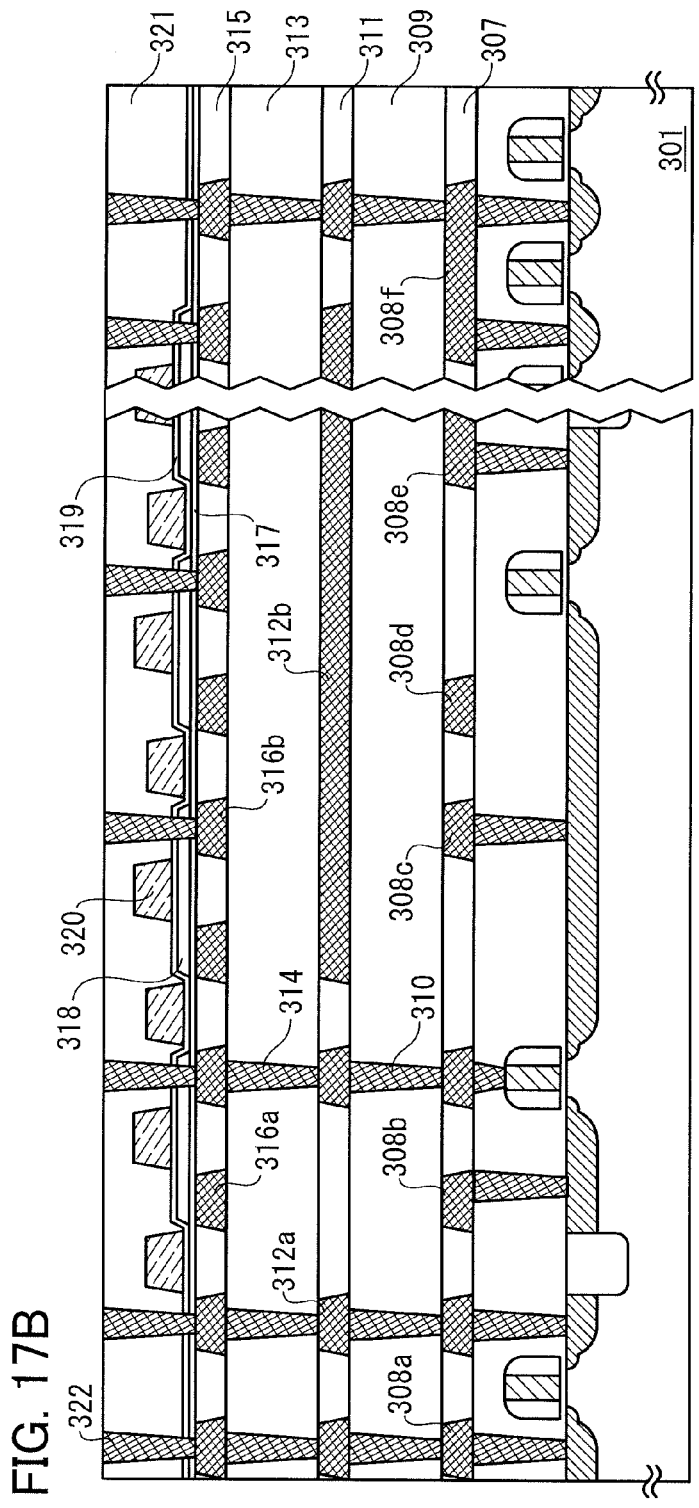

In FIG. 16A, positions of fourth layer wirings 316a and 316b are illustrated. The fourth layer wiring 316a serves as an electrode of a capacitor of a memory cell. The fourth layer wiring 316b serves as a drain electrode of a transistor of a memory cell. In FIG. 16B, a position of an oxide semiconductor layer 318 is illustrated. In FIG. 16C, positions of a word line 320 and a fourth contact plug 322 are illustrated.

FIGS. 17A and 17B will be described below. Note that Embodiment 2 or 4 can be referred to for details of a manufacturing process. FIG. 17A illustrates a state of a cross section at a stage (which corresponds to FIG. 15A) where the first contact plug 306 is formed. The element separation insulator 302 is formed over one surface of a substrate 301, and the first layer wirings 304a to 304h (the first layer wirings 304g and 304h are not shown in FIGS. 17A and 17B) are formed. Further, the n-type impurity region 303N and the p-type impurity region 303P (which are not shown in FIGS. 17A and 17B) are formed. Then, the first interlayer insulator 305 and the first contact plug 306 are formed.

In FIG. 17B, a state where another layer is overlapped is illustrated. In the state illustrated in FIG. 17A, the following are further stacked: a first embedded insulator 307, the second layer wirings 308a to 308f, a second interlayer insulator 309, the second contact plug 310, a second embedded insulator 311, the third layer wirings 312a and 312b, a third interlayer insulator 313, the third contact plug 314, a third embedded insulator 315, the fourth layer wirings 316a and 316b, an insulator 317 for a capacitor, the oxide semiconductor layer 318, a gate insulator 319, the word line 320, a fourth interlayer insulator 321, and the fourth contact plug 322.

From the above steps, one memory cell layer can be formed. An integration degree can be increased by stacking more memory cell layers as in Embodiment 2. In FIG. 17B, a plurality of memory cells are shown. In each of the memory cells, the fourth layer wirings 316a and 316b are provided below the bottom surface of the oxide semiconductor layer 318. Between the fourth layer wirings 316a and 316b, the fourth layer wiring 316a serves as a counter electrode of the capacitor of the memory cell. Further, either the third contact plug 314 or the fourth contact plug 322 and the fourth layer wiring 316b are connected to serve as part of the sub bit line SBL_n_m.

This application is based on Japanese Patent Application serial no. 2010-218567 filed with Japan Patent Office on Sep. 29, 2010, Japanese Patent Application Serial No. 2010-239525 filed with Japan Patent Office on Oct. 26, 2010, and Japanese Patent Application Serial No. 2010-253556 filed with Japan Patent Office on Nov. 12, 2010, the entire contents of which are hereby incorporated by reference.

What is claimed is:

1. A semiconductor memory device comprising:
a bit line;
four word lines;
a first selection line parallel to the four word lines;
a second selection line parallel to the four word lines; and
two cells each including two memory cells, a sub bit line, a first selection transistor, a second selection transistor, and an amplifier circuit,
wherein a drain of the first selection transistor is connected to the bit line,
wherein a gate of the first selection transistor and a gate of the second selection transistor are connected to the first selection line and the second selection line, respectively,
wherein a source of the first selection transistor and a first terminal of the amplifier circuit are connected to the sub bit line,
wherein a second terminal of the amplifier circuit is connected to a source of the second selection transistor,
wherein a drain of the second selection transistor is connected to the bit line,
wherein each of the two memory cells includes a transistor and a capacitor,
wherein capacitance of the capacitor is 1 fF or less, and
wherein the transistor of each of the two memory cells comprises a gate connected to one of the four word lines.

2. The semiconductor memory device according to claim 1, wherein the first selection transistor and the transistor of each of the two memory cells are provided in different layers.

3. The semiconductor memory device according to claim 1, wherein a semiconductor used for the first selection transistor and a semiconductor used for the transistor of each of the two memory cells are of different kinds.

4. The semiconductor memory device according to claim 1, wherein the transistor of one of the two memory cells and the transistor of the other the two memory cells are provided in different layers.

5. The semiconductor memory device according to claim 1, wherein the amplifier circuit is a complementary inverter.

6. The semiconductor memory device according to claim 1, wherein each of the two cells includes 4 to 64 memory cells.

7. The semiconductor memory device according to claim 1, wherein a necessary depth or a necessary height for the capacitor is 1 µm or less.

8. The semiconductor memory device according to claim 1, wherein the amplifier circuit is a NMOS circuit.

9. The semiconductor memory device according to claim 1, wherein the amplifier circuit is a PMOS circuit.

10. A semiconductor memory device comprising:
a bit line;
four word lines;

a first selection line parallel to the four word lines;
a second selection line parallel to the four word lines; and
two cells each including two memory cells, a sub bit line, a first selection transistor, a second selection transistor, and an amplifier circuit,
wherein a drain of the first selection transistor is connected to the bit line,
wherein a gate of the first selection transistor and a gate of the second selection transistor are connected to the first selection line and the second selection line, respectively,
wherein a source of the first selection transistor and a first terminal of the amplifier circuit are connected to the sub bit line,
wherein a second terminal of the amplifier circuit is connected to a source of the second selection transistor,
wherein a third terminal of the amplifier circuit is electrically connected to the bit line,
wherein each of the two memory cells includes a transistor and a capacitor,
wherein capacitance of the capacitor is 1 fF or less, and
wherein the transistor of each of the two memory cells comprises a gate connected to one of the four word lines.

11. The semiconductor memory device according to claim 10, wherein the first selection transistor and the transistor of each of the two memory cells are provided in different layers.

12. The semiconductor memory device according to claim 10, wherein a semiconductor used for the first selection transistor and a semiconductor used for the transistor of each of the two memory cells are of different kinds.

13. The semiconductor memory device according to claim 10, wherein the transistor of one of the two memory cells and the transistor of the other the two memory cells are provided in different layers.

14. The semiconductor memory device according to claim 10, wherein the amplifier circuit is a complementary inverter.

15. The semiconductor memory device according to claim 10, wherein each of the two cells includes 4 to 64 memory cells.

16. The semiconductor memory device according to claim 10, wherein a necessary depth or a necessary height for the capacitor is 1 μm or less.

17. The semiconductor memory device according to claim 10, wherein the amplifier circuit is a NMOS circuit.

18. The semiconductor memory device according to claim 10, wherein the amplifier circuit is a PMOS circuit.

* * * * *